US011776983B2

(12) United States Patent
Yamashita et al.

(10) Patent No.: US 11,776,983 B2
(45) Date of Patent: Oct. 3, 2023

(54) IMAGE SENSOR

(71) Applicant: TAIWAN SEMICONDUCTOR MANUFACTURING COMPANY, LTD., Hsinchu (TW)

(72) Inventors: Yuichiro Yamashita, Hsinchu (TW); Chun-Hao Chuang, Hsinchu (TW); Hirofumi Sumi, Yokohama (JP)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 17/224,813

(22) Filed: Apr. 7, 2021

(65) Prior Publication Data
US 2021/0225908 A1   Jul. 22, 2021

Related U.S. Application Data

(60) Continuation of application No. 16/892,428, filed on Jun. 4, 2020, now Pat. No. 10,991,747, which is a division of application No. 16/201,083, filed on Nov. 27, 2018, now Pat. No. 10,700,117, which is a division of application No. 14/942,441, filed on Nov. 16, 2015, now Pat. No. 10,163,959.

(51) Int. Cl.
*H01L 27/146* (2006.01)

(52) U.S. Cl.
CPC ...... *H01L 27/1464* (2013.01); *H01L 27/1462* (2013.01); *H01L 27/1463* (2013.01);
(Continued)

(58) Field of Classification Search
CPC ............. H01L 27/1464; H01L 27/1462; H01L 27/14623; H01L 27/1463; H01L 27/14638;
(Continued)

(56) References Cited

U.S. PATENT DOCUMENTS 8,390,089 B2   3/2013   Chen et al.
9,373,656 B2   6/2016   Park
(Continued)

FOREIGN PATENT DOCUMENTS

CN   102376726 A   3/2012
CN   103000644 A   3/2013
(Continued)

OTHER PUBLICATIONS

Meynants et al., "Backside illuminated global shutter CMOS image sensors", 2011 IISW Program, 2011 International Image Sensor Workshop, Jun. 8-11, 2011, (16 pages total), http://www.imagesensors.org/Past%20Workshops/2011%20Workshop/2011%20Papers/2011%20IISW%.

*Primary Examiner* — Cuong B Nguyen
(74) *Attorney, Agent, or Firm* — Birch, Stewart, Kolasch & Birch, LLP

(57) ABSTRACT

Image sensor structures are provided. The image sensor structure includes a substrate and a light-sensing region formed in the substrate. The image sensor structure further includes a first isolation structure surrounding the light sensing region and having an opening region in a top view and a second isolation structure formed in the substrate. In addition, the second isolation structure surrounds the light-sensing region and vertically overlaps both the opening region and the first isolation structure. The image sensor structure further includes a first gate structure formed over the substrate and overlapping the opening region, the first isolation structure, and the second isolation structure.

20 Claims, 28 Drawing Sheets

(52) U.S. Cl.
CPC .. *H01L 27/14623* (2013.01); *H01L 27/14638* (2013.01); *H01L 27/14643* (2013.01); *H01L 27/14689* (2013.01)

(58) Field of Classification Search
CPC ............. H01L 27/14689; H01L 25/167; H01L 31/107; H01L 27/14643–14663; H01L 27/14
See application file for complete search history.

(56) References Cited

U.S. PATENT DOCUMENTS

| | | |
|---|---|---|
| 2010/0181635 A1 | 7/2010 | Wang et al. |
| 2012/0025199 A1 | 2/2012 | Chen et al. |
| 2014/0035083 A1 | 2/2014 | Wan et al. |
| 2014/0077323 A1 | 3/2014 | Velichko et al. |
| 2014/0091377 A1 | 4/2014 | Kao et al. |
| 2014/0327051 A1 | 11/2014 | Ahn et al. |
| 2015/0129943 A1 | 5/2015 | Kato et al. |
| 2015/0214266 A1 | 7/2015 | Kao et al. |
| 2015/0255495 A1 | 9/2015 | Park |
| 2015/0372031 A1 | 12/2015 | Yoon et al. |
| 2016/0204150 A1 | 7/2016 | Oh et al. |

FOREIGN PATENT DOCUMENTS

| | | |
|---|---|---|
| CN | 103378114 A | 10/2013 |
| TW | 201403803 A | 1/2014 |

IMAGE SENSOR

PRIORITY CLAIM AND CROSS-REFERENCE

This application is a Continuation application of U.S. patent application Ser. No. 16/892,428, filed on Jun. 4, 2020, which is a Divisional application of U.S. patent application Ser. No. 16/201,083, filed on Nov. 27, 2018, which is a Divisional application of U.S. patent application Ser. No. 14/942,441, filed on Nov. 16, 2015, the entirety of which are incorporated by reference herein.

BACKGROUND

Semiconductor integrated circuit devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances.

Many of the technological advances in semiconductors have occurred in the field of image sensing. A backside illuminated (BSI) image sensor is one of the types of image sensors used in integrated circuits. However, although existing backside illuminated image sensors have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
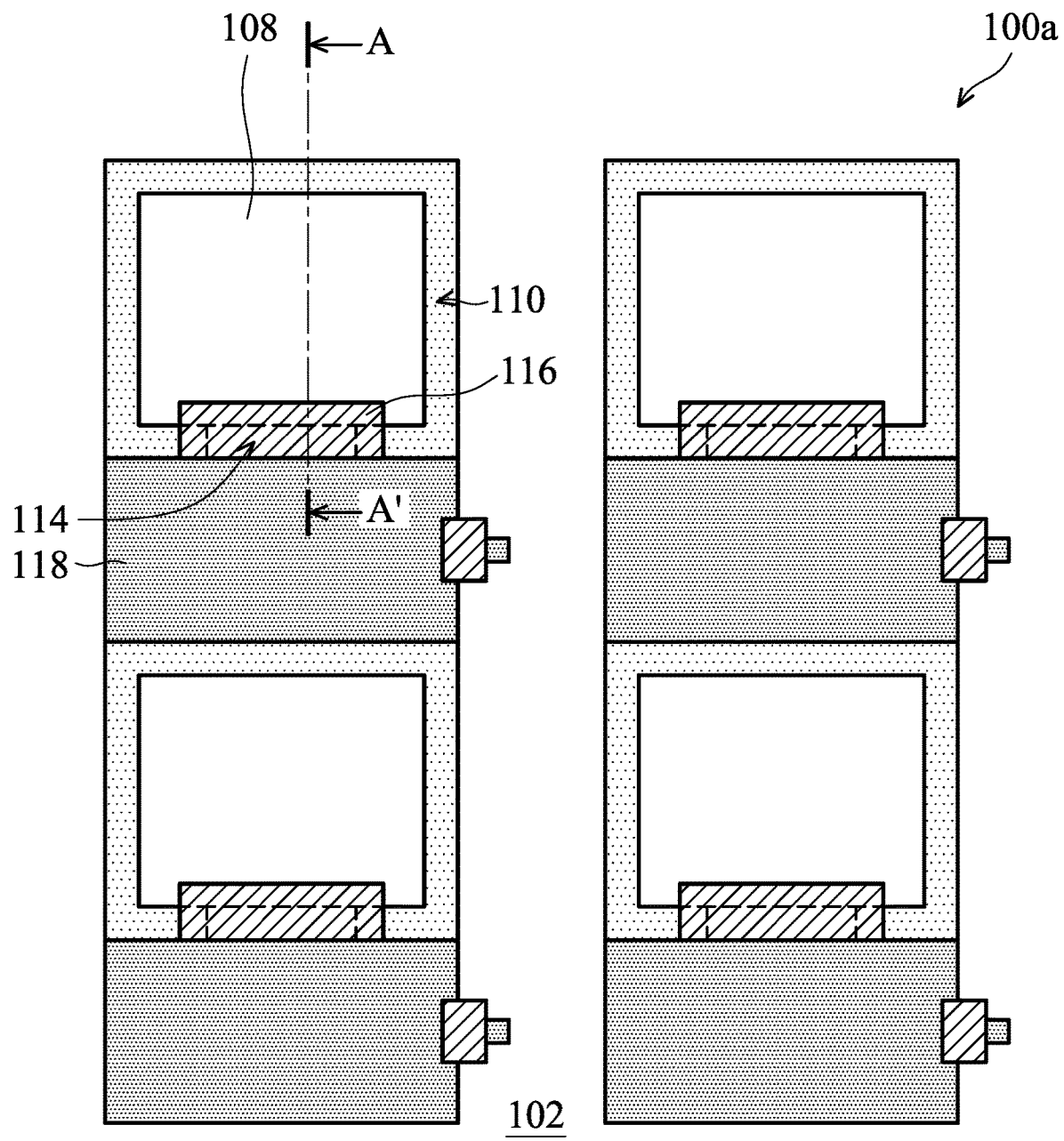
FIG. 1A is a pixel layout shown from a front side of an image sensor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of an image sensor structure and methods for forming the same are provided. The image sensor structure may be a backside illuminated (BSI) image sensor and includes a front side isolation structure and the backside isolation structure formed around its light-sensing region. The front side isolation structure and the backside isolation structure may prevent parasitic light from entering the neighboring storage node, so that the performance of the image sensor structure may be improved.

Figure 1B:
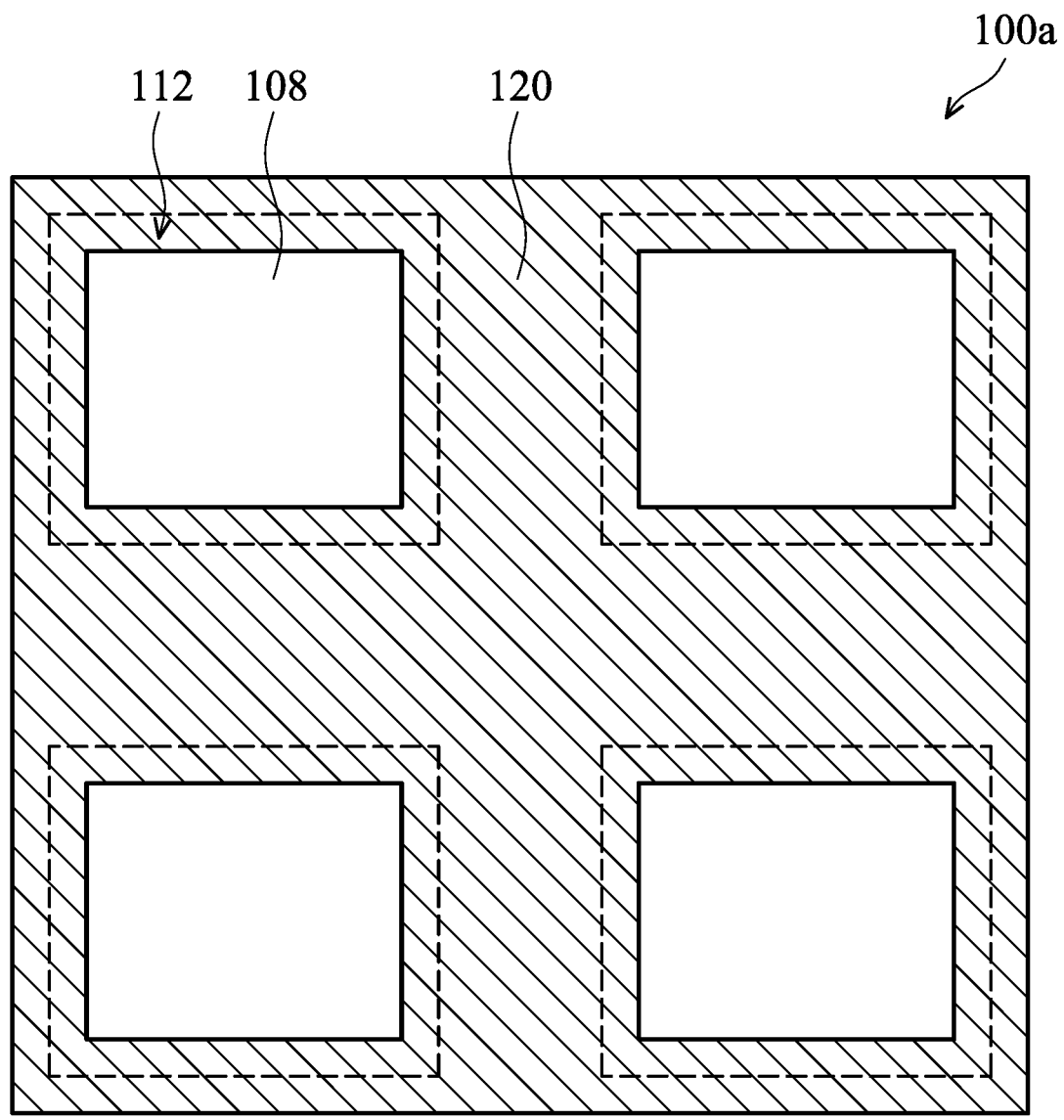
FIG. 1B is a pixel layout shown from the backside of the image sensor structure in accordance with some embodiments.
Figure 1C:
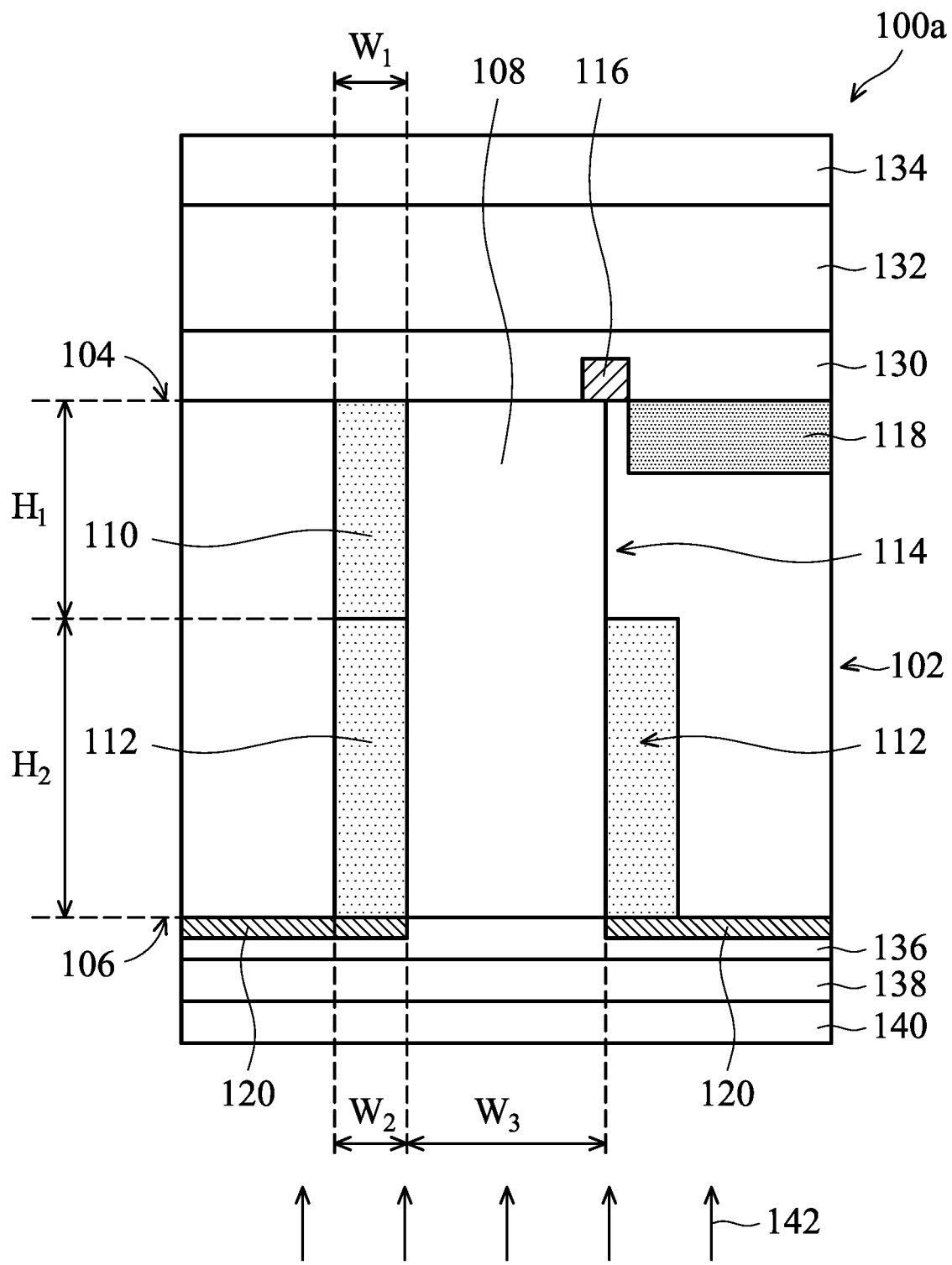
FIG. 1C is a cross-sectional representation of the image sensor structure shown along line A-A' shown in FIG. 1A in accordance with some embodiments.

FIG. 1A is a pixel layout shown from a front side of an image sensor structure 100a in accordance with some embodiments. FIG. 1B is a pixel layout shown from the backside of the image sensor structure 100a in accordance with some embodiments. FIG. 1C is a cross-sectional representation of the image sensor structure 100a shown along line A-A' shown in FIG. 1A in accordance with some embodiments.

The image sensor structure 100a includes a substrate 102, and the substrate 102 has a front side 104 and a backside 106, as shown in FIGS. 1A to 1C in accordance with some embodiments. In some embodiments, the substrate 102 is a semiconductor substrate including silicon. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

A light-sensing region 108 is formed in the substrate 102 in accordance with some embodiments. In some embodiments, the light-sensing region 108 formed through the substrate 102, as shown in FIG. 1C. The light-sensing region 108 may be configured to sense (detect) incident light. For example, the light-sensing region 108 may correspond to a specific range of wavelengths, such as red light, green light, or blue light. In some embodiments, the light-sensing region 108 includes a photodiode structure.

The light-sensing region 108 may be formed by performing ion implantation processes on the substrate 102. The ion implantation processes may include multiple implant processes, and various dopants, implant dosages, and implantation energies may be used. In an embodiment, the light-sensing region 108 includes dopants having an opposite doping polarity as those in the substrate 102.

The image sensor structure 100a further includes a front side isolation structure 110 and a backside isolation structure 112 formed around the light-sensing region 108 in accordance with some embodiments. More specifically, the front side isolation structure 110 is formed at the front side of the substrate 102, as shown in FIG. 1C. The front side isolation structure 110 may prevent light cross-talk between neighboring pixels. In some embodiments, the front side isolation structure 110 partially surrounds the upper portion of the light-sensing region 108, as shown in FIG. 1A. In some embodiments, the front side isolation structure 110 has an opening region 114 at one side of the upper portion of the light-sensing region 108, so that a portion of the light-sensing region 108 is not surrounded by the front side isolation structure 110.

The front side isolation structure 110 may be made of a material which is capable of blocking light from passing through. In some embodiments, the front side isolation structure 110 is made of nitride or oxide, such as silicon oxide or silicon nitride. In some embodiments, the front side isolation structure 110 is an air gap. In some embodiments, the front side isolation structure 110 has a width $W_1$ in a range from about 50 nm to about 0.3 μm. In some cases, the width $W_1$ of the front side isolation structure 110 may be controlled not to be too large, so the light-sensing region 108 may have a greater size. On the other hand, in some cases, the width $W_1$ of the front side isolation structure 110 may be controlled not to be too thin, or the formation of the front side isolation structure 110 may be challenging.

In some embodiments, the front side isolation structure 110 has a height $H_1$ in a range from about 0.25 μm to about 1.5 μm. In some cases, the height $H_1$ of the front side isolation structure 110 cannot be too large, or the opening region 114 of the front side isolation structure 110 may also be too large and the performance of the image sensor structure 100a may be undermined.

The backside isolation structure 112 is formed at the backside 106 of the substrate 102, as shown in FIG. 1C. In addition, unlike the front side isolation structure 110, the backside isolation structure 112 fully surrounds the bottom portion of the light-sensing region 108 in accordance with some embodiments. In some embodiments, the backside isolation structure 112 is in direct contact with the front side isolation structure 110.

The backside isolation structure 112 may be made of a material which is capable of blocking light from passing through. In some embodiments, the backside isolation structure 112 is made of nitride or oxide, such as silicon oxide or silicon nitride. In some embodiments, the backside isolation structure 112 is made of a metal, such as tungsten. In some embodiments, the front side isolation structure 110 and the backside isolation structure 112 are made of different materials. In some embodiments, the front side isolation structure 110 is made of a dielectric material and the backside isolation structure 223 is made of metal. The isolation structure made of metal may have good optical isolating ability but tend to melt under high temperature. Therefore, the front side isolation structure 110 may be made of a dielectric material, which can stand a relatively high temperature performed in subsequent manufacturing processes, while the backside isolation structure 223 may be made of metal.

In some embodiments, the backside isolation structure 112 is made of has a width $W_2$ in a range from about 50 nm to about 0.3 μm. Similarly, the width $W_2$ of the backside isolation structure 112 may be controlled, so that the light-sensing region 108 will have a greater size but the formation of the backside isolation structure 112 will not be too challenging. In some embodiments, the backside isolation structure 112 has a height in a range from about 0.25 μm to about 3 μm. In some cases, the height $H_2$ of the backside isolation structure 112 cannot be too large, or the backside isolation structure 112 may touch the storage node 118. In some embodiments, the light-sensing region 108 has a width $W_3$ in a range from about 0.5 μm to about 5 μm.

A gate structure 116 is formed over the front side 104 of the substrate 102, and a storage node 118 is formed adjacent to the gate structure 116, as shown in FIGS. 1A and 1C in accordance with some embodiments. The gate structure 116 may be partially overlapped with the light-sensing region 108. In some embodiments, the gate structure 116 includes polysilicon. In some embodiments, the gate structure 116 is a multi-gate structure, such as a FinFET gate structure.

The storage node 118 is formed at the front side 104 of the substrate 102 and is located at the side of the light-sensing region 108 that is not completely surrounded by the front side isolation structure 110. As shown in FIG. 1A, the storage node 118 is formed adjacent to the opening region 114 of the front side isolation structure 110, so that the light-sensing region 108 is not isolated from the storage node 118 by the front side isolation structure 110.

The storage node 118 is formed so that the electrons induced in the light-sensing region 108 can be transferred into the storage node 118 and be further transferred into a read-out transistor. By using the storage node 118, image acquisition of various pixels may be performed (e.g. start and stop) simultaneously. Therefore, the performance of the image sensor structure 110a may be improved. For example, global shutter function can be enabled. In some embodiments, the storage node 118 is formed by an implanting process.

The image sensor structure 100a further includes a light shielding layer 120 formed over the backside 106 of the substrate 102, as shown in FIGS. 1B and 1C in accordance with some embodiments. The light shielding layer 120 is configured to block the light from directly entering the storage node 118 from the backside 106 of the substrate 102. On the other hand, the light-sensing region 108 is not covered by the light shielding layer 120, so that light can incident from the backside 106 of substrate 102 and enter into the light-sensing region 108. In some embodiments, the light shielding layer 120 is made of a metal, such as aluminum or tungsten.

Figure 3A:
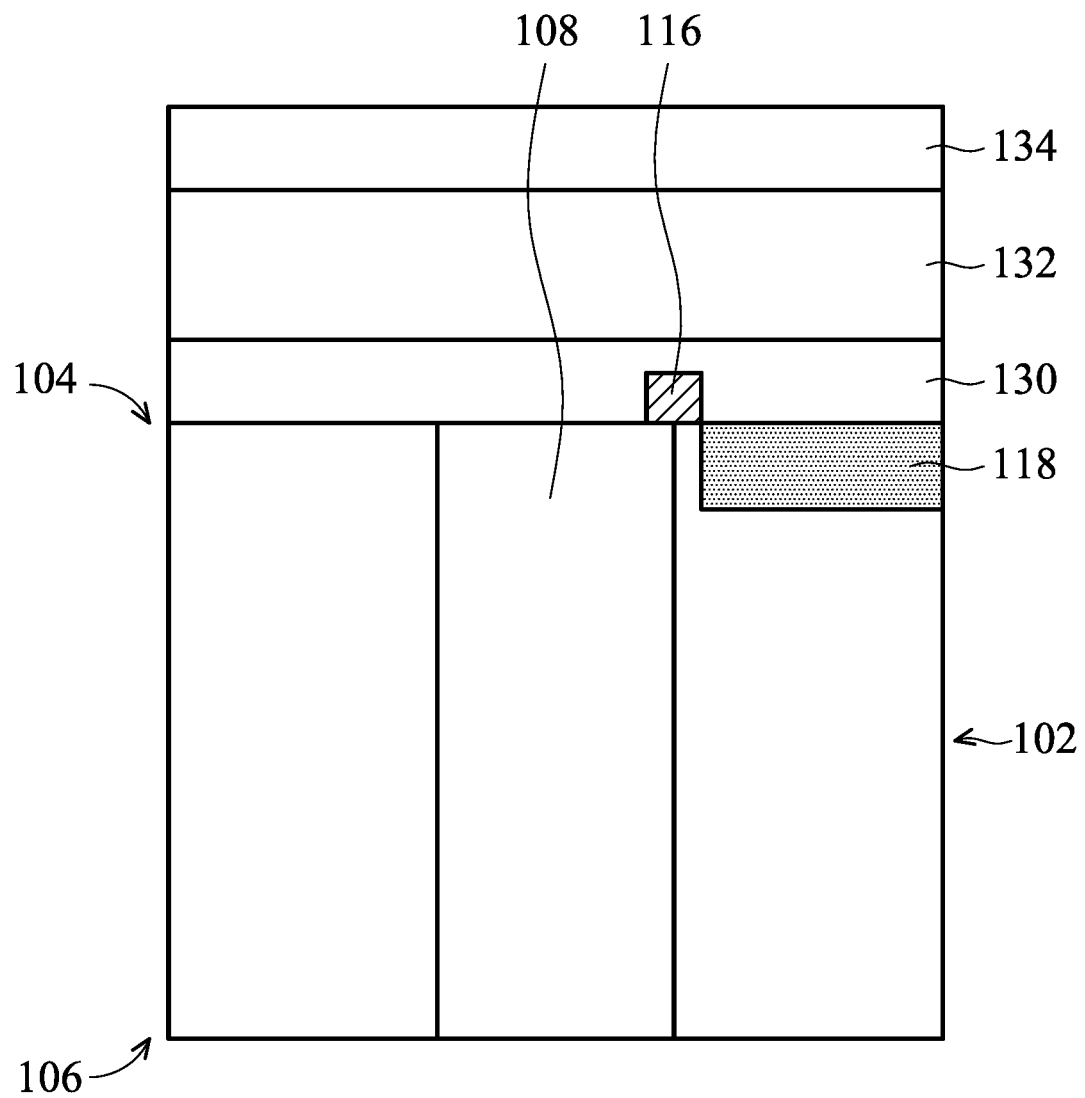
FIGS. 3A to 3D are cross-sectional representations of various stages of forming an image sensor structure in accordance with some embodiments.
Figure 3B:
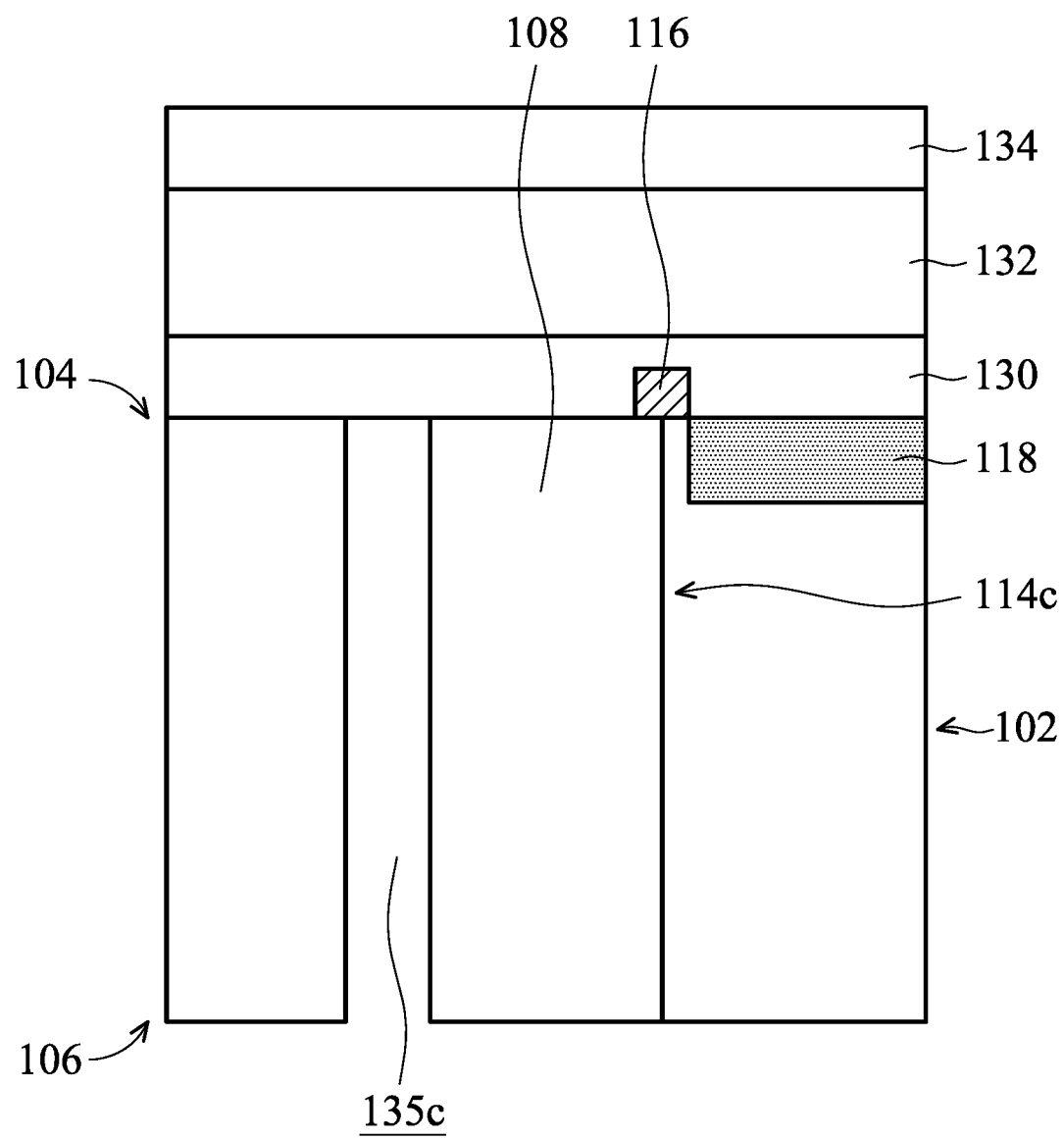

In addition, the image sensor structure 100a further includes an interlayer dielectric layer 130, an interconnect structure layer 132, and a supporting substrate 134 formed over the front side 104 of the substrate, as shown in FIG. 3B in accordance with some embodiments. As shown in FIG. 1C, the gate structure 116 is covered by the interlayer dielectric layer 130. The interlayer dielectric layer 130 may include multilayers made of multiple dielectric materials, such as silicon oxide, silicon nitride, silicon oxynitride, and/or other applicable low-k dielectric materials. The interlayer dielectric layer 130 may be formed by chemical vapor deposition (CVD), physical vapor deposition, (PVD), atomic layer deposition (ALD), spin-on coating, or other applicable processes.

The interconnect structure layer 132 is formed over interlayer dielectric layer 130 and may include numbers of conductive features formed in a dielectric layer. In some embodiments, the dielectric layer is inter-metal dielectric (IMD) layer. In some embodiments, the dielectric layer includes multilayers made of multiple dielectric materials, such as silicon oxide, silicon nitride, silicon oxynitride, phosphosilicate glass (PSG), borophosphosilicate glass (BPSG), or other applicable low-k dielectric materials. The dielectric layer may be formed by a chemical vapor deposition (CVD), physical vapor deposition, (PVD), atomic layer deposition (ALD), spin-on coating, or other applicable processes.

The conductive features may include vertical interconnects, such as vias and contacts, and/or horizontal interconnects, such as conductive lines. In some embodiments, the conductive features are made of conductive materials, such as aluminum, aluminum alloy, copper, copper alloy, titanium, titanium nitride, tungsten, polysilicon, or metal silicide.

In addition, the image sensor structure 100a also includes an antireflective layer 136, a color filter layer 138, and a microlens layer 140 formed over the backside 106 of the substrate 102, as shown in FIG. 1C in accordance with some embodiments. In some embodiments, the antireflective layer 136 is made of silicon carbide nitride, silicon oxide, or the like. After antireflective layer 136 is formed, a passivation layer, such as a silicon nitride layer or a silicon oxynitride layer, may be formed over the antireflective layer 136.

The color filter layer 138 may include more than one color filter. The color filters may be aligned with the light-sensing regions 108 formed in the substrate 102. The color filters may be made of a dye-based (or pigment-based) polymer for filtering out a specific frequency band of light. In addition, the microlens layer 140 disposed on the color filter layer 138 may include more than one microlens. The microlenses in the microlens layer 140 may be aligned with the color filters in the color filter layer 138.

As shown in FIG. 1C, an incident light 142 may enter the substrate 102 from its backside 106 in accordance with some embodiments. More specifically, the incident light 142 may pass through the microlens layer 140, the color filter layer 138, and the antireflective layer 136 and enter into the light-sensing region 108 from the backside 106 of the substrate 102. Afterwards, the electrons induced in the light-sensing region 108 may be transferred to the storage node 118 through the opening region 114 of the front side isolation structure 110. In addition, since the incident light is blocked by the light shielding layer 120, the backside isolation structure 112, and the front side isolation structure 110, the incident light 142 will not directly reach the storage node 118. Therefore, the risk of the storage node 118 being interfered by parasitic light may be reduced. Therefore, the performance of the image sensor structure 100a may be improved.

It should be noted the image sensor structure 100a has been simplified for better understanding the concept of the disclosure. For example, the image sensor may include additional elements, such as reset transistors, floating diffusion, source follower transistor, row select transistor, capacitors, or the like, although they are not shown in FIGS. 1A to 1C. In addition, the number of light-sensing regions formed in the image sensor structure 100a may vary, and the scope of the disclosure is not intended to be limiting.

The front side isolation structure and the backside isolation structure described above may be formed using various methods, and the scope of the disclosure is not intended to be limiting. FIGS. 2A to 2E are cross-sectional representations of various stages of forming an image sensor structure 100b in accordance with some embodiments. The image sensor structure 100b may be similar to, or the same as, the previously described image sensor structure 100a. Therefore, the materials and processes used to form the image sensor structure 100b that are similar to, or the same as, those used to form the image sensor structure 100a are not repeated herein.

Figure 2A:
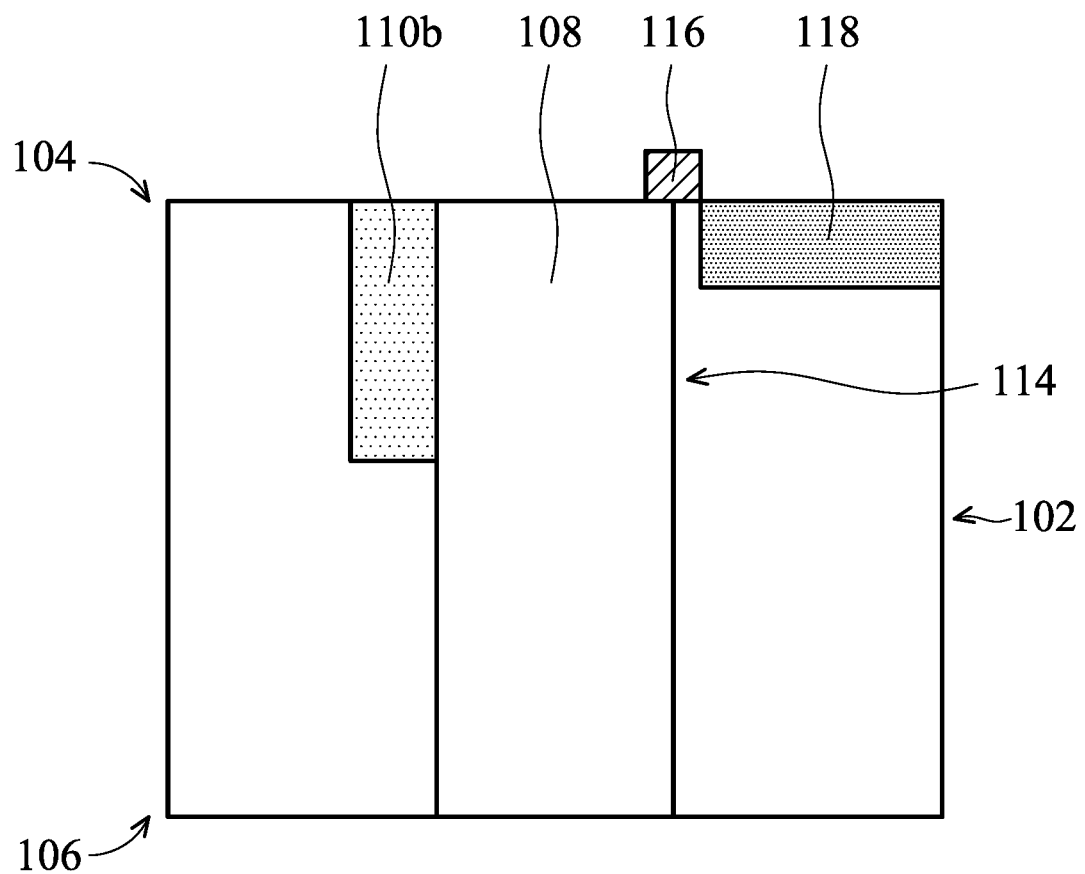
FIGS. 2A to 2E are cross-sectional representations of various stages of forming an image sensor structure in accordance with some embodiments.

As shown in FIG. 2A, the light-sensing region 108, a front side isolation structure 110b, and the storage node 118 are formed from the front side 104 of the substrate 102 in accordance with some embodiments. The gate structure 116 is formed over the front side 104 of the substrate 102. As described previously, the front side isolation structure 110b is formed around the upper portion of the light-sensing region 108 but having the opening region 114 at one side of the light-sensing region 108. Accordingly, the light-sensing region 108 is not completely enclosed by the front side isolation structure 110*b*, and the electrons can be transferred from the light-sensing region 108 to the storage node 118 through the opening region 114.

In some embodiments, the front side isolation structure 110*b* may be formed by etching the substrate 102 from the front side of the substrate 102 to form a trench, and filling the trench with an isolating material.

Figure 2B:
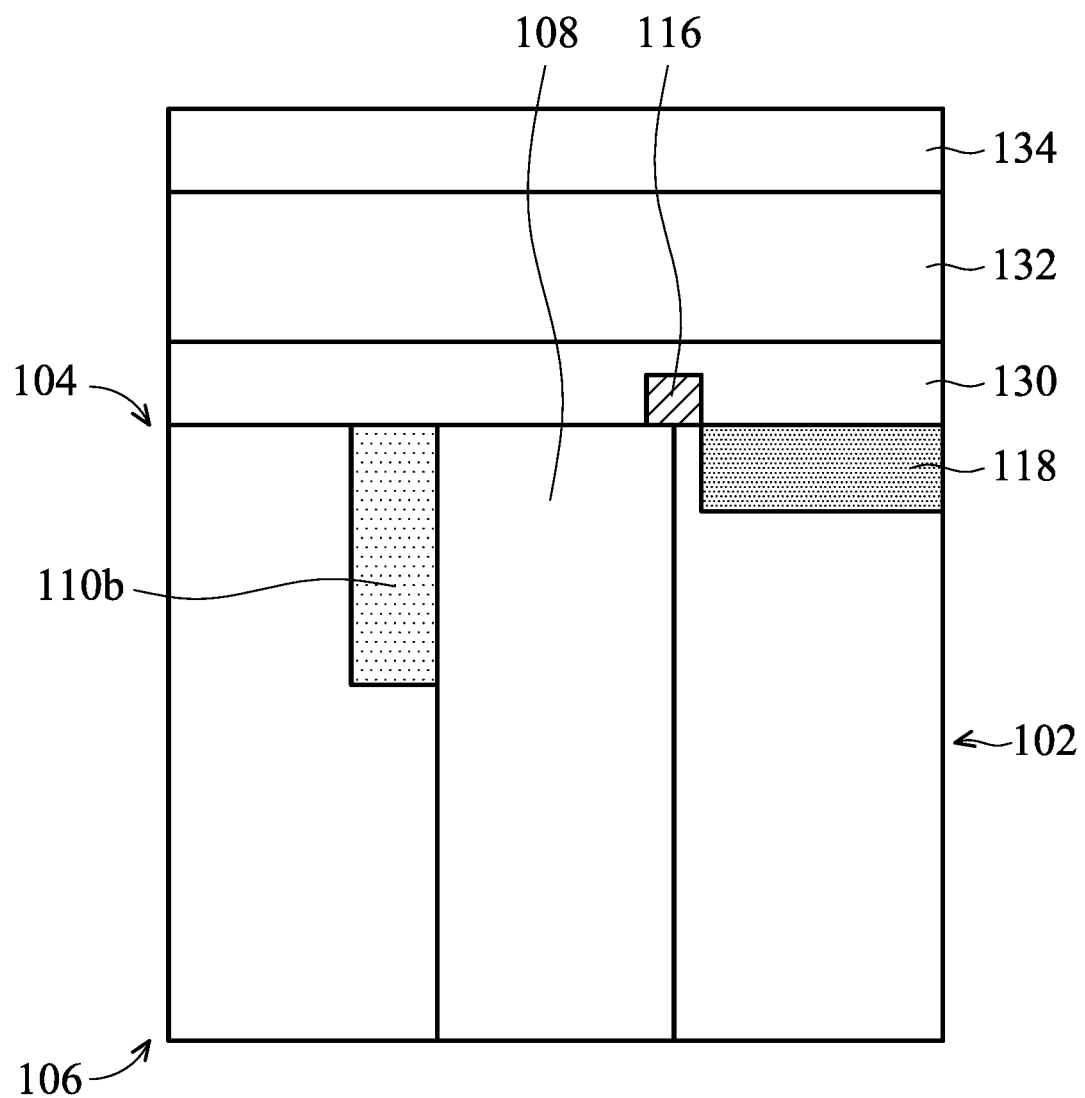

Next, the interlayer dielectric layer 130, the interconnect structure layer 132, and the supporting substrate 134 are formed over the front side 104 of the substrate 102, and a polishing process may be performed on the backside 106 of the substrate 102, as shown in FIG. 2B in accordance with some embodiments. The polishing process may be performed on the backside 106 of the substrate until the light-sensing region 108 is exposed from the backside 106 of the substrate. It should be noted that additional elements may be formed in the interlayer dielectric layer 130, the interconnect structure layer 132, and the supporting substrate 134, although they are not shown in FIG. 2B.

Figure 2C:
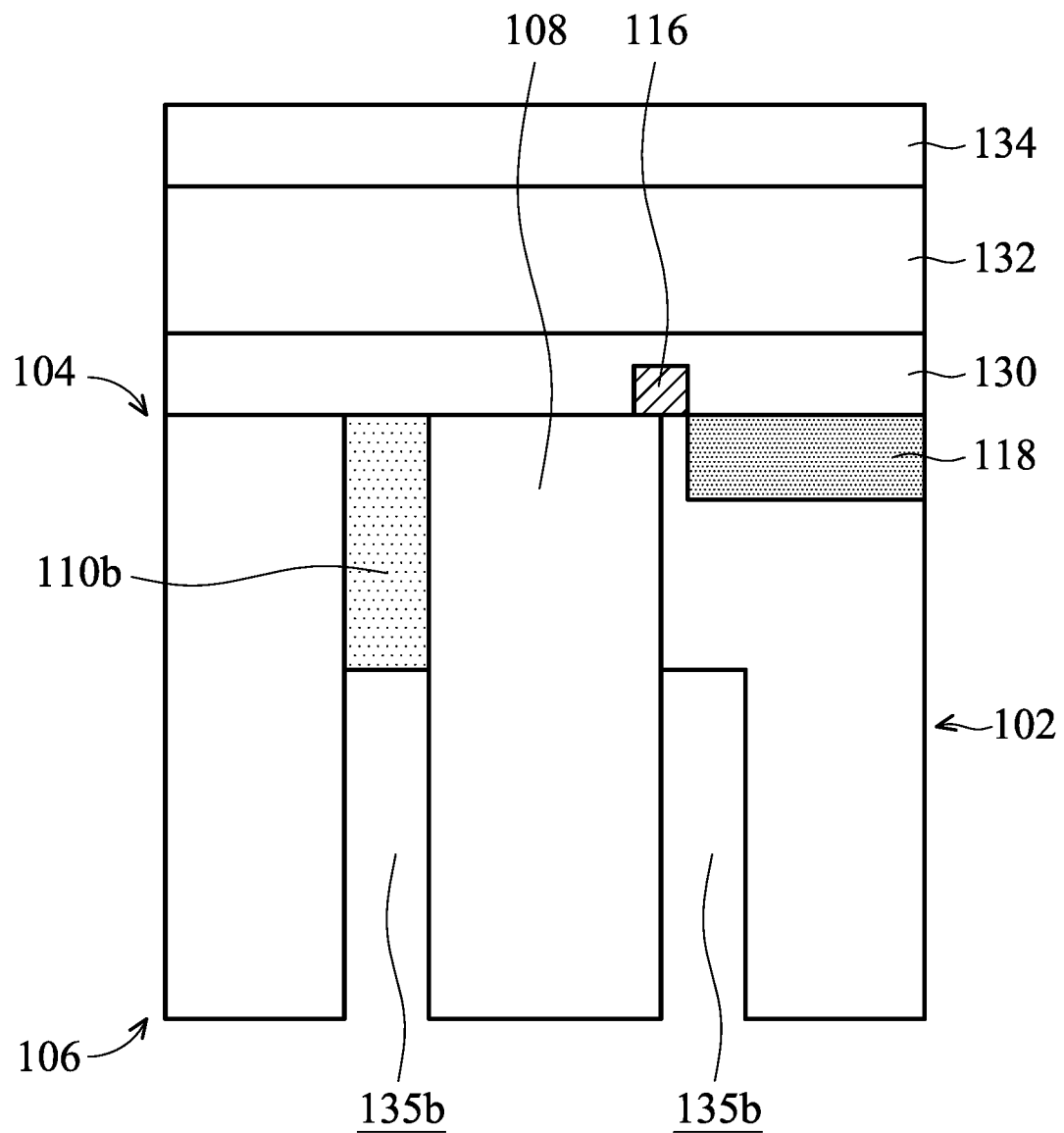
Figure 2D:
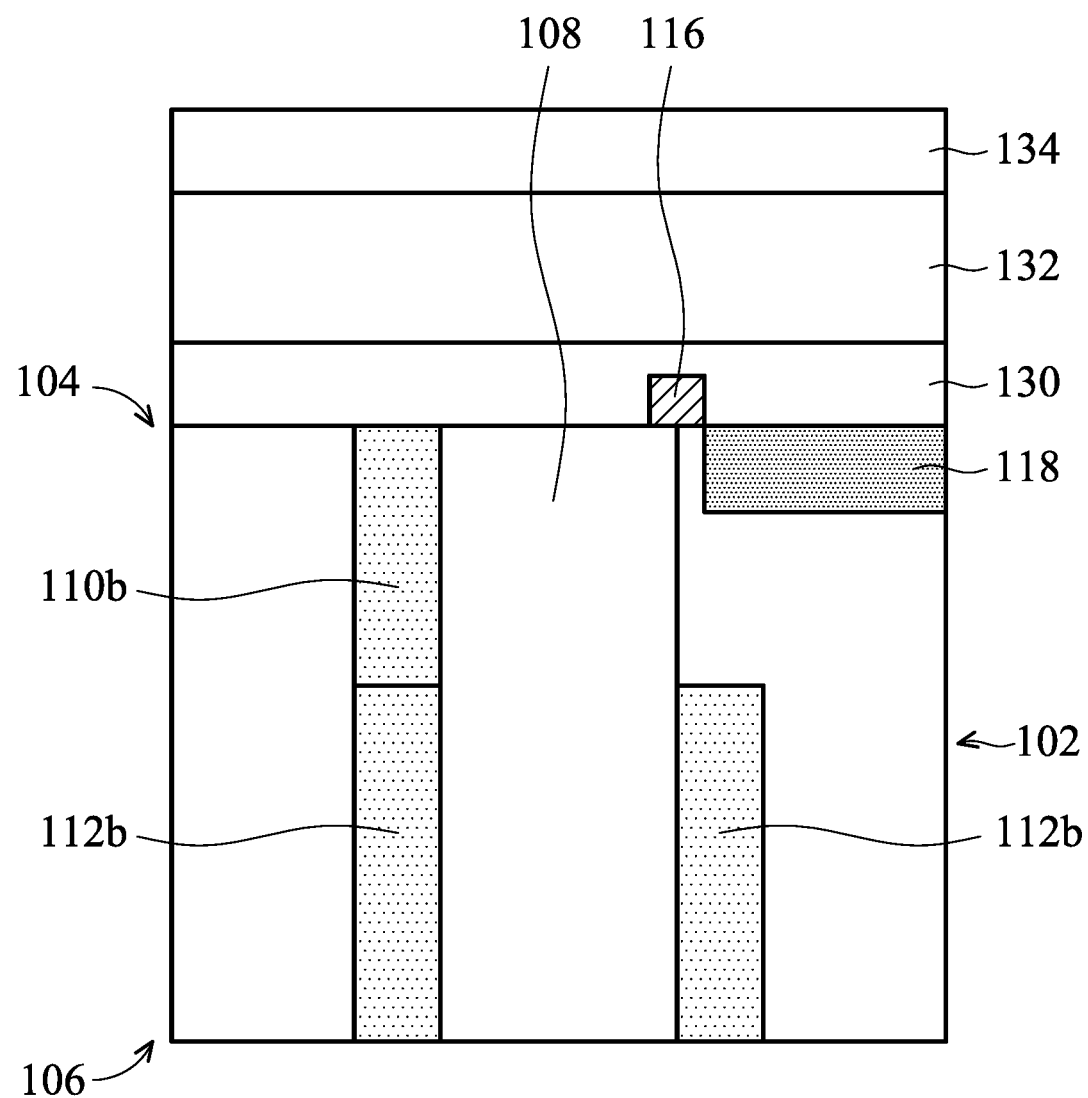
Figure 2E:
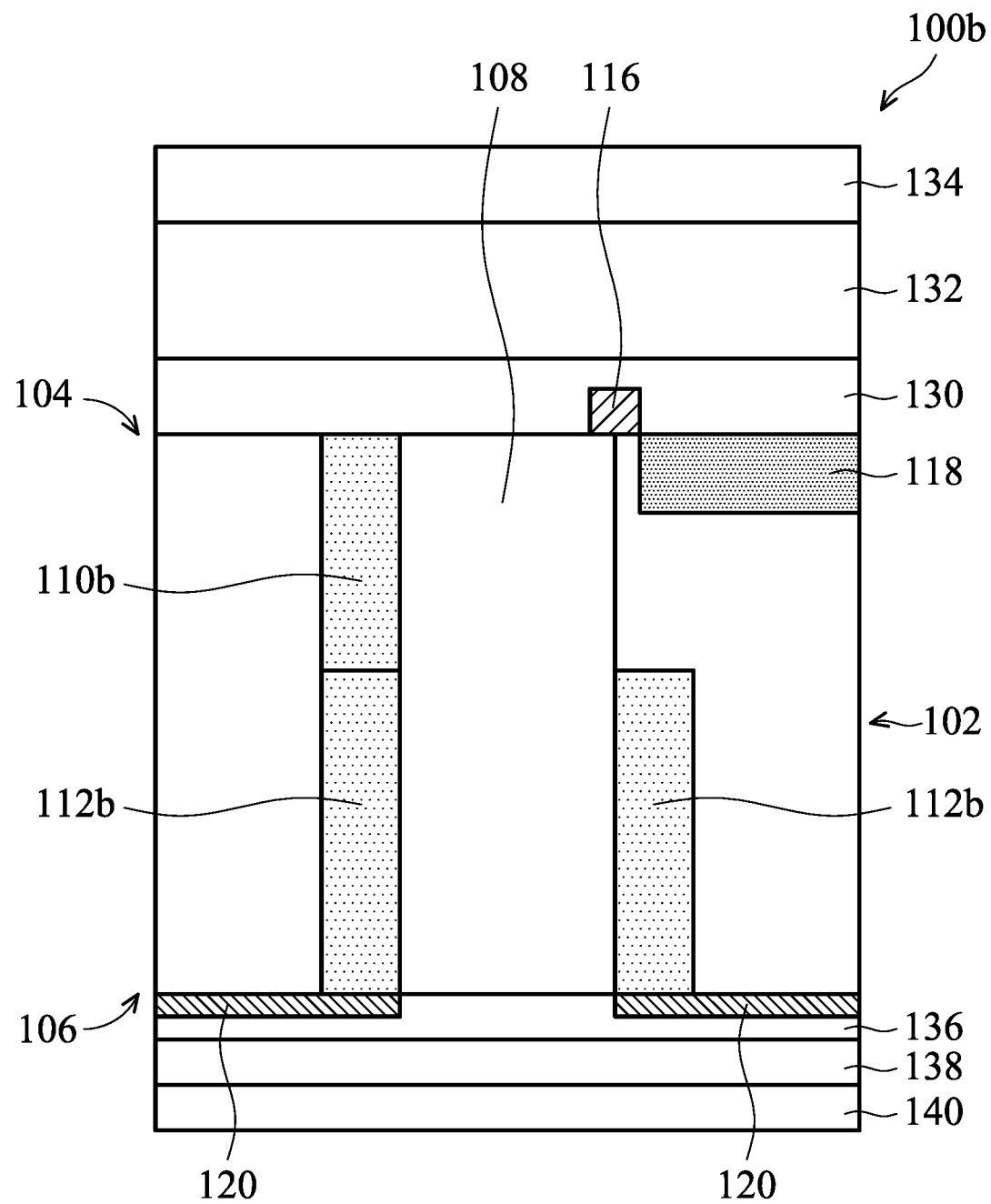

Afterwards, a trench 135*b* may be formed from the backside 106 of the substrate 102, as shown in FIG. 2C in accordance with some embodiments. The trench 135*b* is formed around the bottom portion of the light-sensing region 108. After the trench 135*b* is formed, the backside isolation structure 112*b* is formed in the trench 135*b* so that the bottom portion of the light-sensing region 108 is surrounded by the backside isolation structure 112*b*.

After the backside isolation structure 112*b* is formed, the light shielding layer 120, the antireflective layer 136, the color filter layer 138, and the microlens layer 140 are formed over the backside 106 of the substrate 102 to form the image sensor structure 100*b*.

FIGS. 3A to 3D are cross-sectional representations of various stages of forming an image sensor structure 100*c* in accordance with some embodiments. The image sensor structure 100*c* may be similar to, or the same as, the previously described image sensor structure 100*a*. Therefore, the materials and processes used to form the image sensor structure 100*c* that are similar to, or the same as, those used to form the image sensor structure 100*a* are not repeated herein.

As shown in FIG. 3A, the light-sensing region 108 is formed in the substrate 102, and the storage node 118 is formed at one side of the light-sensing region 108 in accordance with some embodiments. In addition, the gate structure 116, the interlayer dielectric layer 130, the interconnect structure layer 132, and the supporting substrate 134 are formed over the front side 104 of the substrate in accordance with some embodiments. Next, a first trench 135*c* is formed from the backside 106 of the substrate 102, as shown in FIG. 3B in accordance with some embodiments. In addition, the first trench 135*c* is formed around the light-sensing region 108 with an opening region 114*c* at one side of the light-sensing region 108.

Figure 3C:
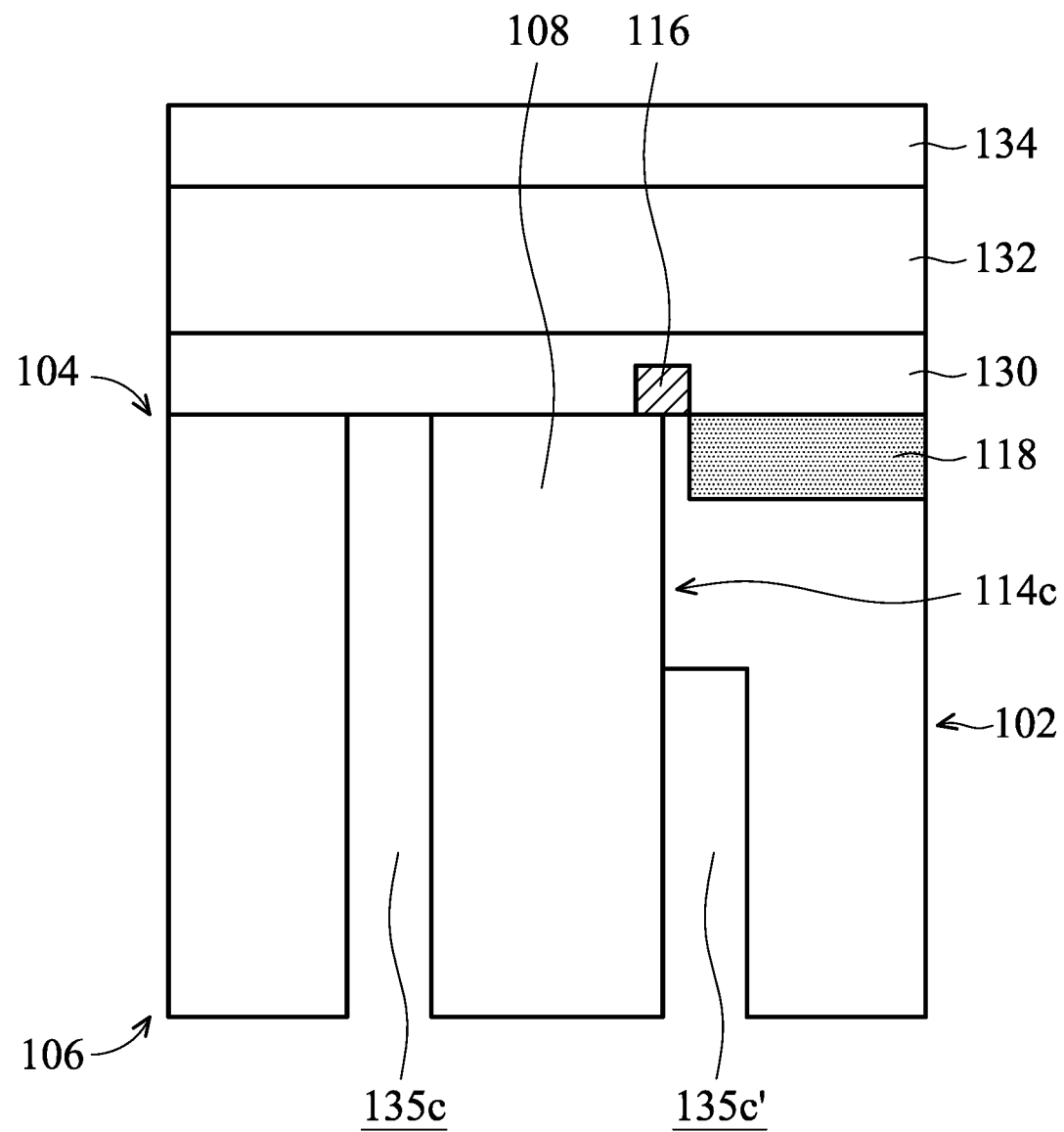
Figure 3D:
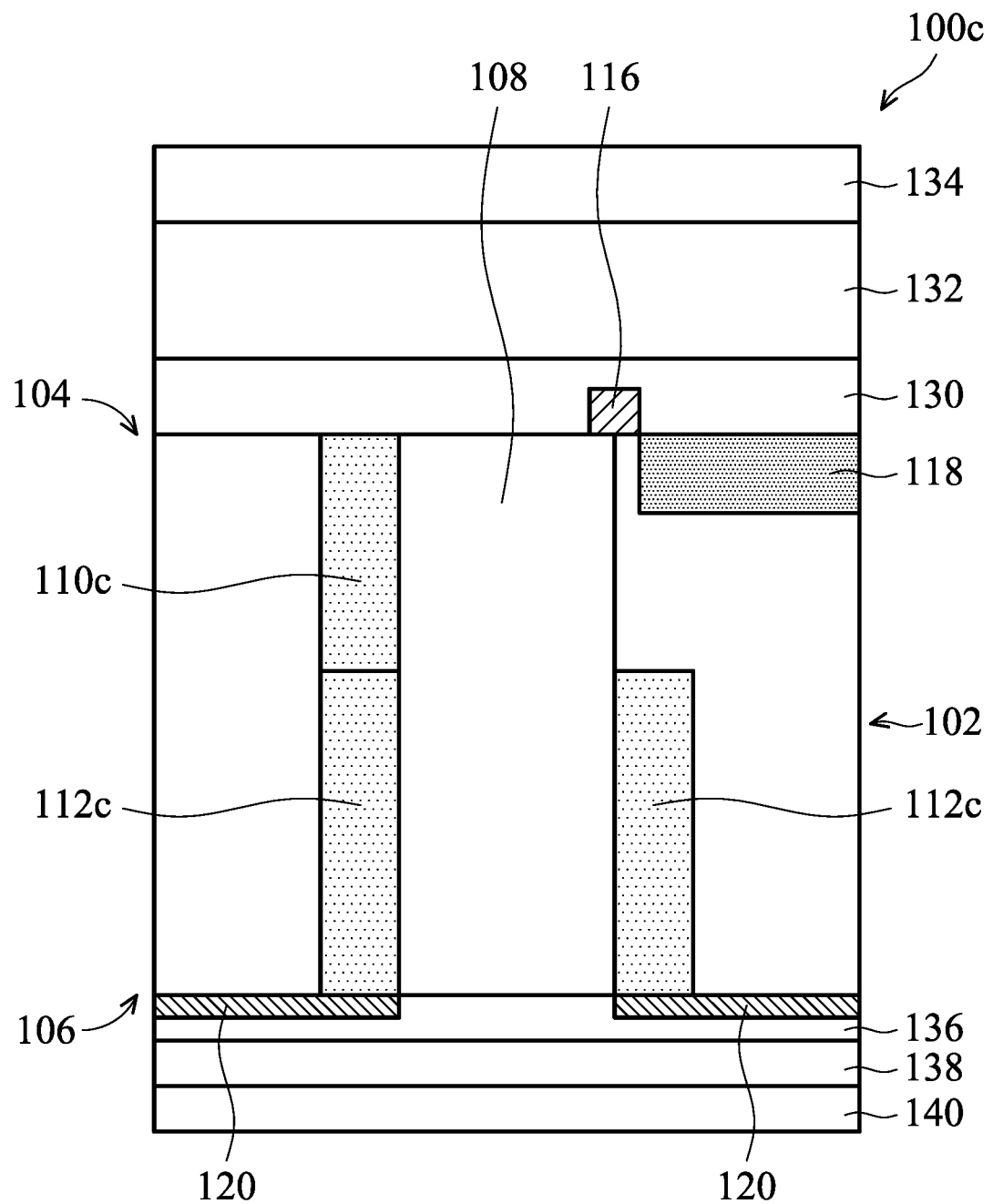

After the first trench 135*c* is formed, a second trench 135*c'* is formed from the backside 106 of the substrate 102, as shown in FIG. 3C in accordance with some embodiments. More specifically, a portion of the substrate 102 is etched from the backside 106 of the opening region 114*c* to form the second trench 135*c'*. However, the second trench 135*c'* does not pass through the substrate 102.

Next, the first trench 135*c* and the second trench 135*c'* are filled with an isolating material to form a front side isolation structure 110*c* and a backside isolation structure 112*c*, as shown in FIG. 3C in accordance with some embodiments. In some embodiments, the front side isolation structure 110*c* and the backside isolation structure 112*c* are made of the same material, and there is no real interface between them. After the front side isolation structure 110*c* and the backside isolation structure 112*c* are formed, the light shielding layer 120, the antireflective layer 136, the color filter layer 138, and the microlens layer 140 are formed over the backside 106 of the substrate 102 to form the image sensor structure 100*c*.

Figure 4A:
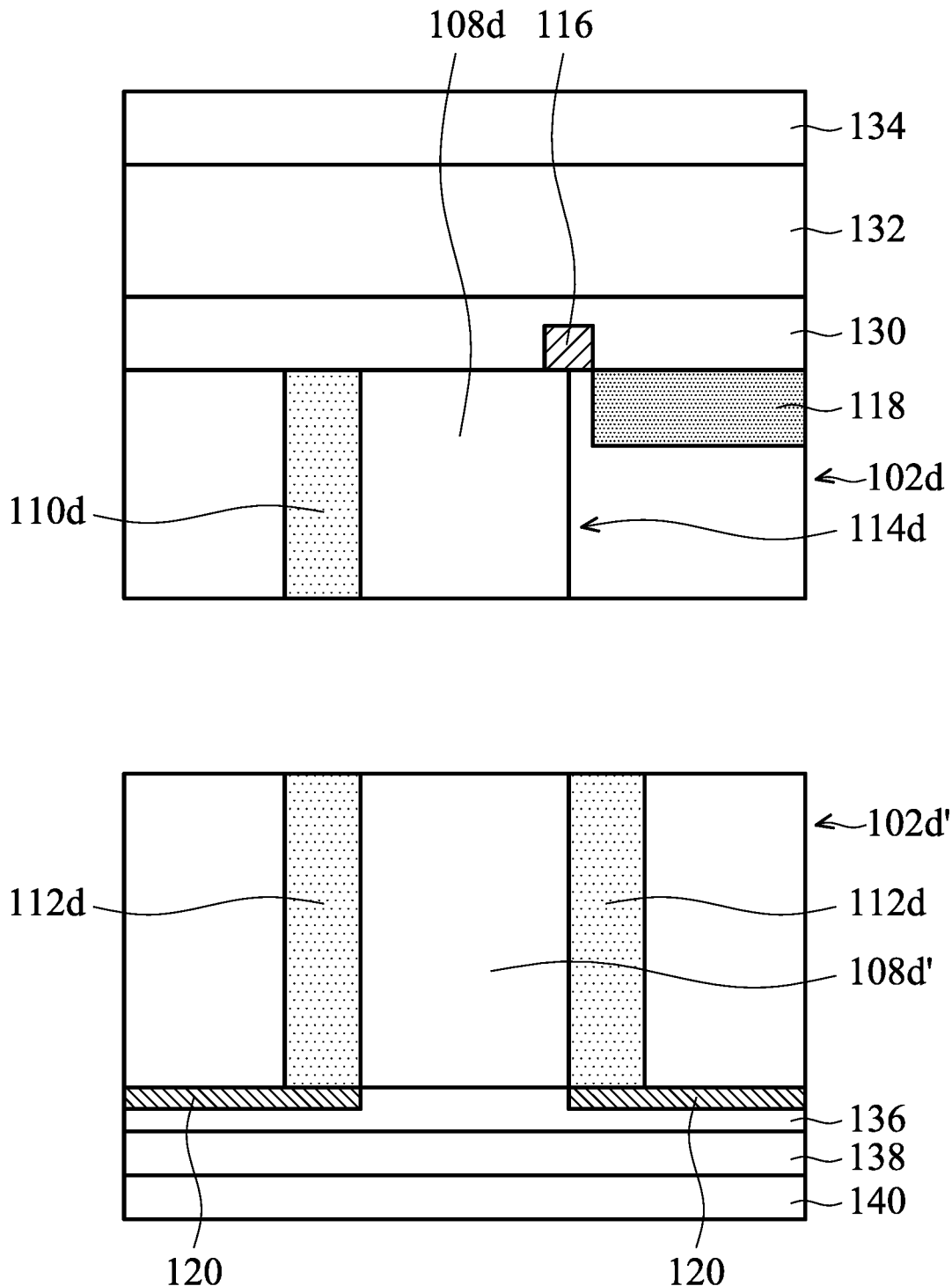
FIGS. 4A to 4B are cross-sectional representations of various stages of forming an image sensor structure in accordance with some embodiments.
Figure 4B:
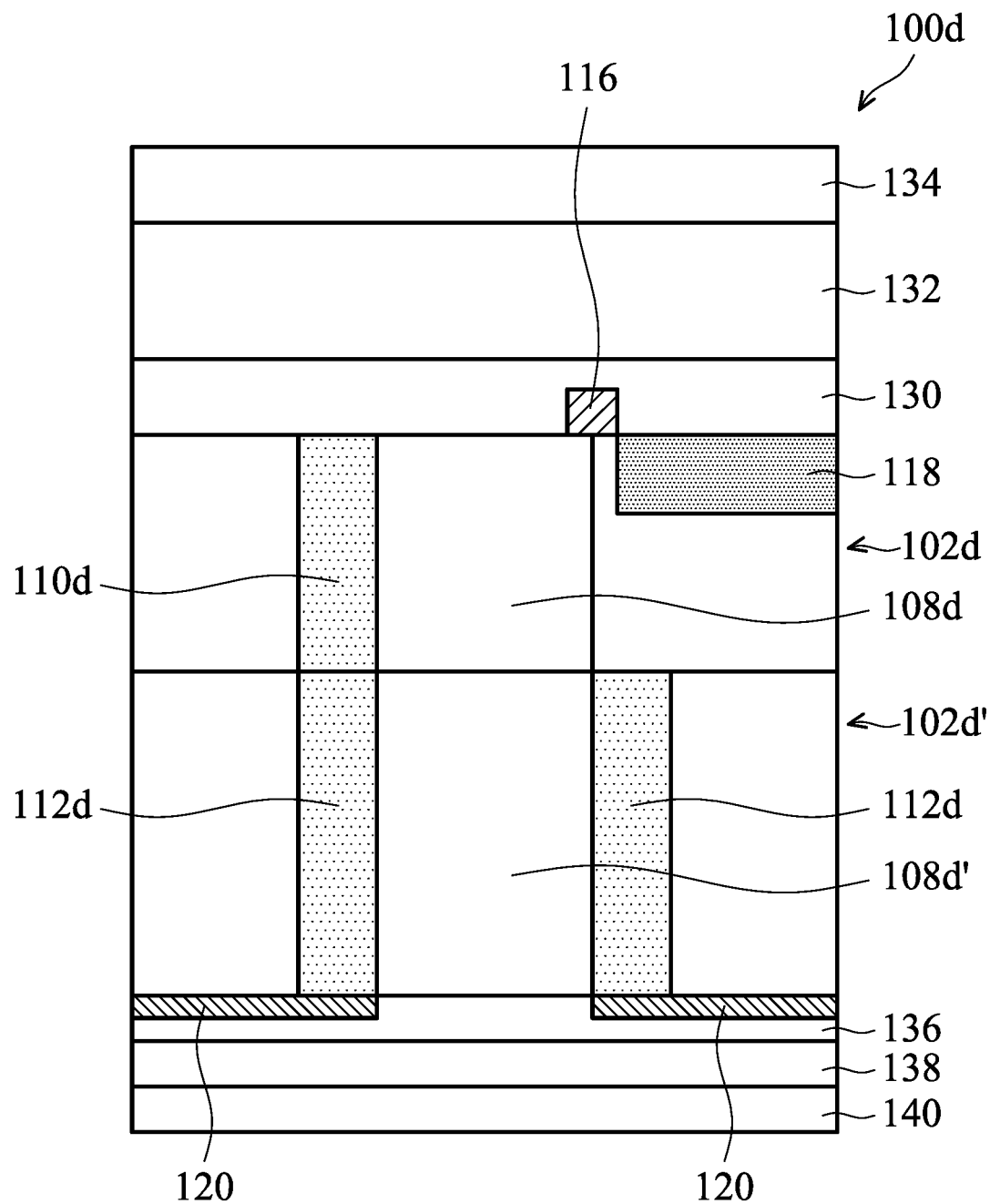

FIGS. 4A to 4B are cross-sectional representations of various stages of forming an image sensor structure 100*d* in accordance with some embodiments. The image sensor structure 100*c* may be similar to, or the same as, the image sensor structure 100*a* described previous. Therefore, the materials and processes used to form the image sensor structure 100*d* that are similar to, or the same as, those used to form the image sensor structure 100*a* are not repeated herein.

As shown in FIG. 4A, a first substrate 102*d* and a second substrate 102*d'* are received in accordance with some embodiments. The first substrate 102*d* includes a first light-sensing region 108*d* formed in the first substrate 102, a front side isolation structure 110*d* formed around the light-sensing region 108*d*, and the storage node 118 formed in the first substrate 102*d* in accordance with some embodiments. As shown in FIG. 4A, the front side isolation structure 110*d* has an opening region 114*d* and the storage node 118 is formed next to the opening region 114*d*. In addition, the gate structure 116, the interlayer dielectric layer 130, the interconnect structure layer 132, and the supporting substrate 134 are formed over the first substrate 102*d*.

In addition, the second substrate 102*d'* includes a second light-sensing region 108*d'* and a backside isolation structure 112*d* formed around the second light-sensing region 108*d'*. Furthermore, the light shielding layer 120, the antireflective layer 136, the color filter layer 138, and the microlens layer 140 are formed over the backside of the second substrate 102*d'*.

Next, the first substrate 102*d* and the second substrate 102*d'* are bonded together to form the image sensor structure 100*d*, as shown in FIG. 4B in accordance with some embodiments. In some embodiments, the first light-sensing region 108*d* is aligned with the second light-sensing region 108*d'*, and the front side isolation structure 110*d* is aligned with the backside isolation structure 112*d*.

Figure 5:
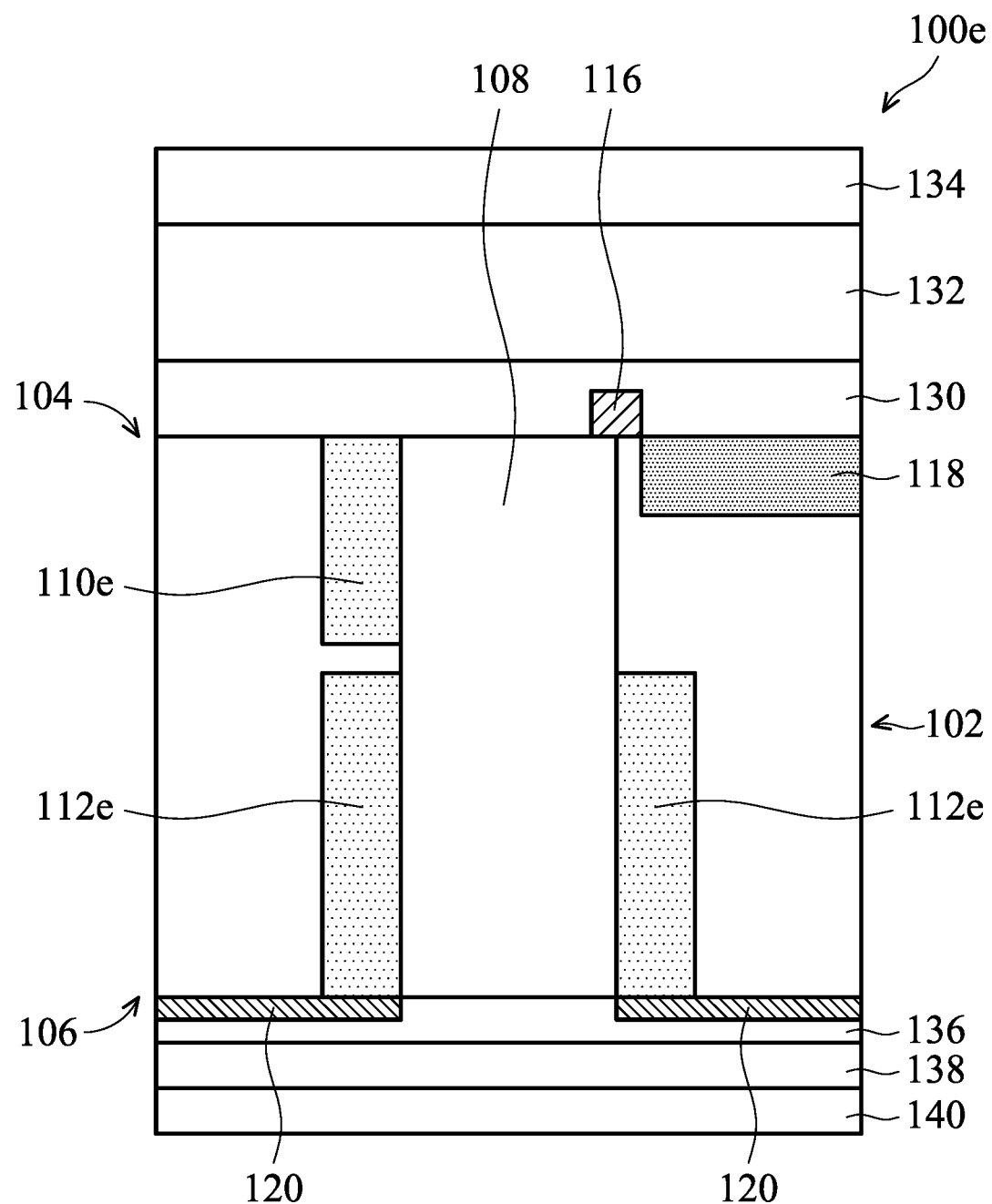
FIG. 5 is a cross-sectional representation of an image sensor structure 100e in accordance with some embodiments.

FIG. 5 is a cross-sectional representation of an image sensor structure 100*e* in accordance with some embodiments. The image sensor structure 100*e* is similar to, or the same as, the image sensor structures described previously, such as the image sensor structure 100*a*, except that its front side isolation structure and backside isolation structure are not connected with each other. Materials and processes used to form the image sensor structure 100*b* may be similar to, or the same as, those described previously and are not repeated herein.

More specifically, the image sensor structure 100*e* also includes the substrate 102 having the front side 104 and the backside 106 and the light-sensing region 108 formed in the substrate 102. In addition, a front side isolation structure 110*e* is formed at the front side 104 and partially surrounds the upper portion of the image sensing region 108. A backside isolation structure 112*e* is formed at the backside 106 of the substrate 102 and fully surrounds the bottom portion of the light-sensing region 108. The gate structure 116 is formed on the front side 104 of the substrate, and the storage node 118 is formed adjacent to the gate structure 116. Interlayer dielectric layer 130, the interconnect structure layer 132, and the supporting substrate 134 are formed over the front side 104 of the substrate 102, and the antireflective layer 136, the color filter layer 138, and the microlens layer 140 are formed over the backside 106 of the substrate 102. As shown in FIG. 5, the front side isolation structure 110e is not connected with the backside isolation structure 112e.

Figure 6A:
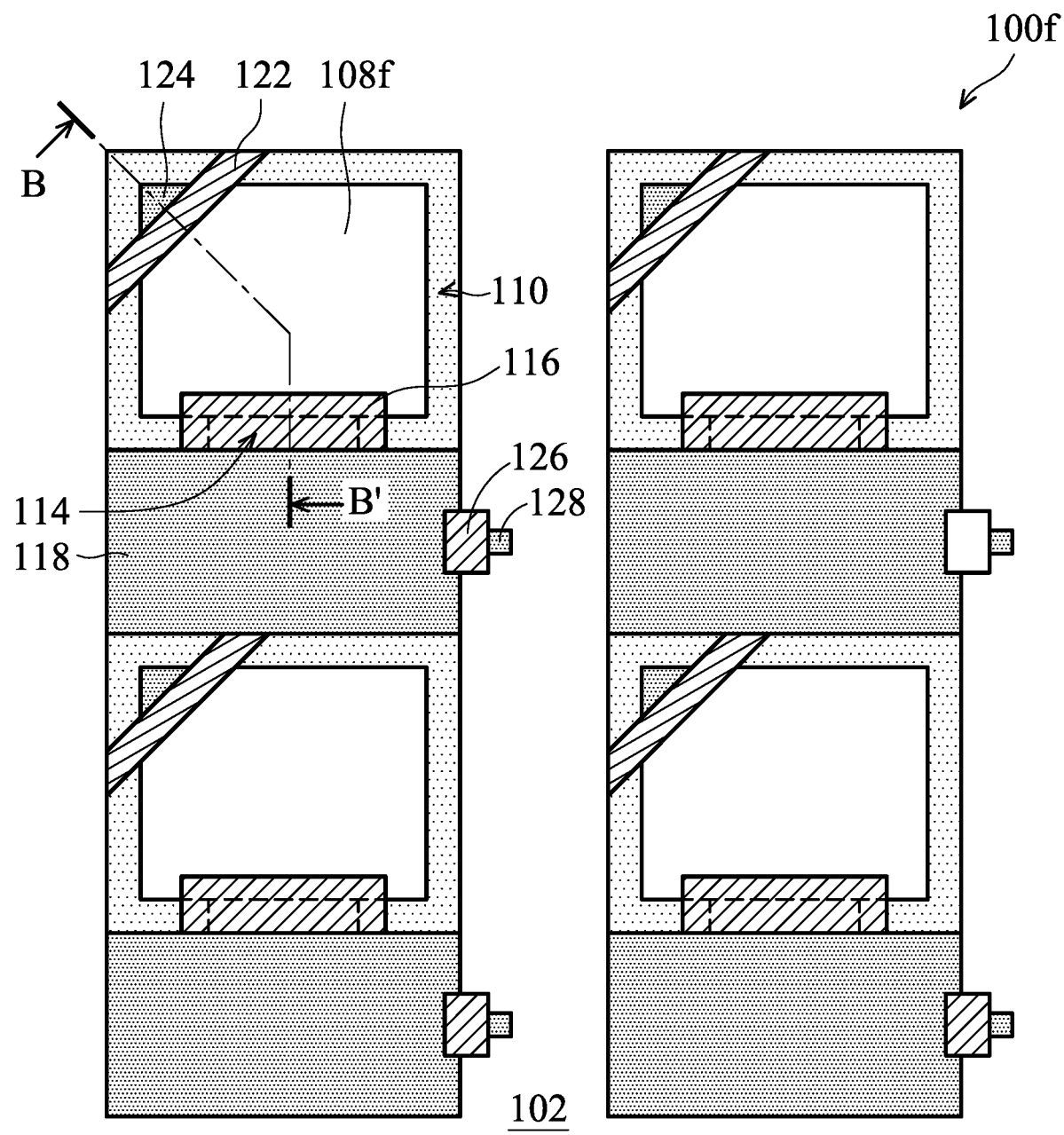
FIG. 6A is a pixel layout shown from a front side of an image sensor structure in accordance with some embodiments.
Figure 6B:
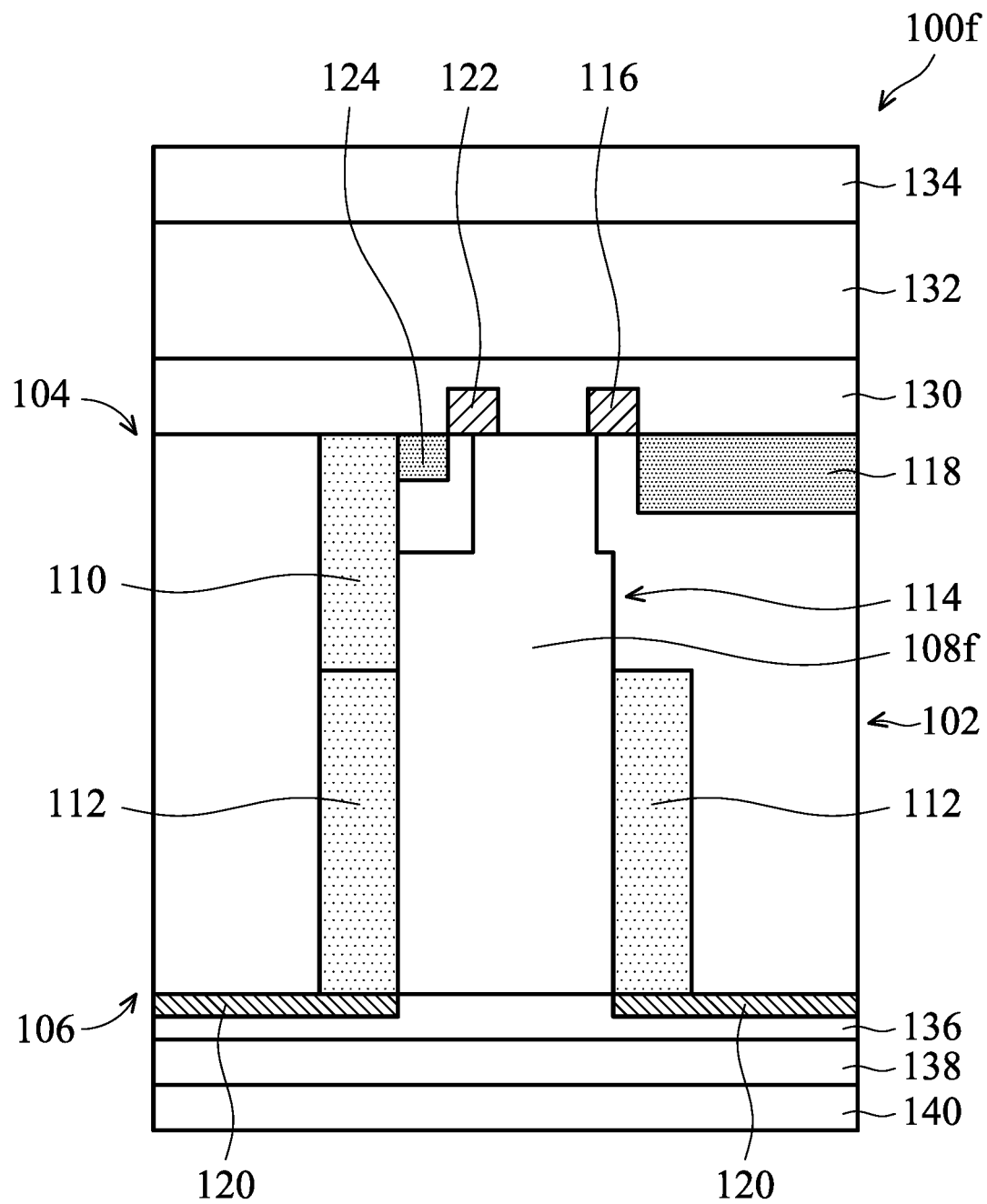
FIG. 6B is a cross-sectional representation of the image sensor structure shown along line B-B' shown in FIG. 6A in accordance with some embodiments.

FIG. 6A is a pixel layout shown from a front side of an image sensor structure 100f in accordance with some embodiments. FIG. 6B is a cross-sectional representation of the image sensor structure 100f shown along line B-B' shown in FIG. 6A in accordance with some embodiments. Some materials and processes used to form the image sensor structure 100f may be similar to, or the same as, those used to formed the image sensor structures described previously and are not repeated herein.

Similar to the image sensor structure 100a, the image sensor structure 100c includes the substrate 102, the front side isolation structure 110, the backside isolation structure 112, the gate structure 116, the storage node 118, the interlayer dielectric layer 130, the interconnect structure layer 132, the supporting substrate 134, the light shielding layer 120, the antireflective layer 136, the color filter layer 138, and the microlens layer 140, as shown in FIGS. 6A and 6B in accordance with some embodiments. In addition, the image sensor structure 100f includes a light-sensing region 108f, which has a smaller upper portion and a larger bottom portion, as shown in FIG. 6B in accordance with some embodiments.

In addition, a gate structure 122 is formed over the front side 104 of the substrate 102, and a drain structure 124 is formed adjacent to the gate structure 122, as shown in FIG. 6A in accordance with some embodiments. The gate structure 122 and the drain structure 124 may be seen as a lateral overflow transistor formed over the front side 104 of the substrate 102. The lateral overflow transistor may be configured to transfer surplus light out from the light-sensing region 108f. In some embodiments, the gate structure 122 is partially overlapped with the light-sensing region 108f, but the drain structure 124 is not in direct contact with the light-sensing region 108f. As described above, the light-sensing region 108f may have a smaller upper portion, so that the light-sensing region 108f will not touch the drain structure 124. In some embodiments, the gate structure 122 is a polysilicon gate structure or a metal gate structure. In some embodiments, the drain structure 124 is formed by implanting processes.

In some embodiments, a gate structure 126 is formed at a side of the storage node 118, and a floating node 128 is formed adjacent to the gate structure 126, as shown in FIG. 6A in accordance with some embodiments. The floating node 128 may be configured to connect with a read-out amplifier. In some embodiments, the gate structure 126 is a polysilicon gate structure or a metal gate structure. In some embodiments, the floating node 128 is formed by implanting processes.

Figure 7A:
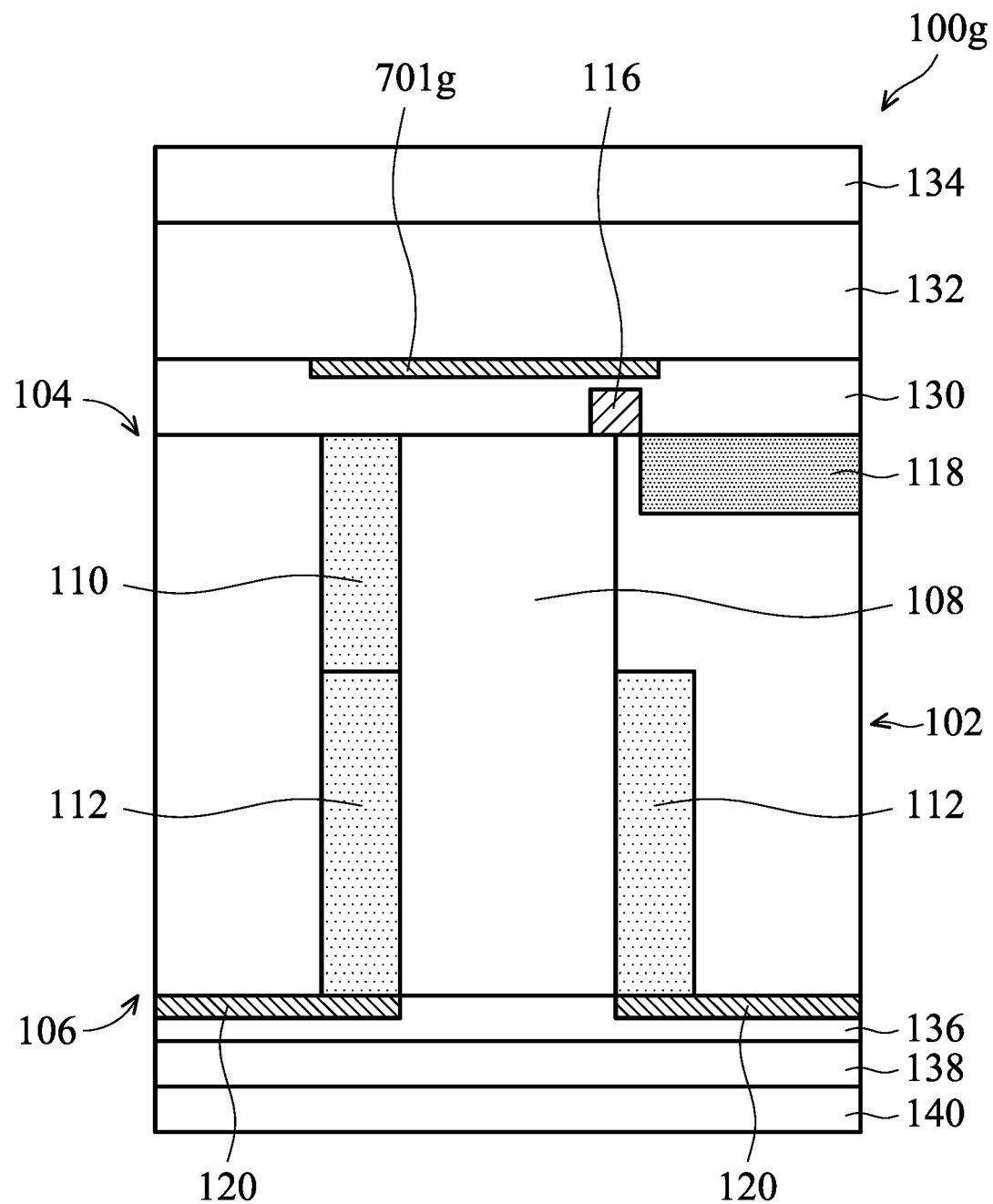
FIG. 7A is a pixel layout shown from a front side of an image sensor structure in accordance with some embodiments.
Figure 7B:
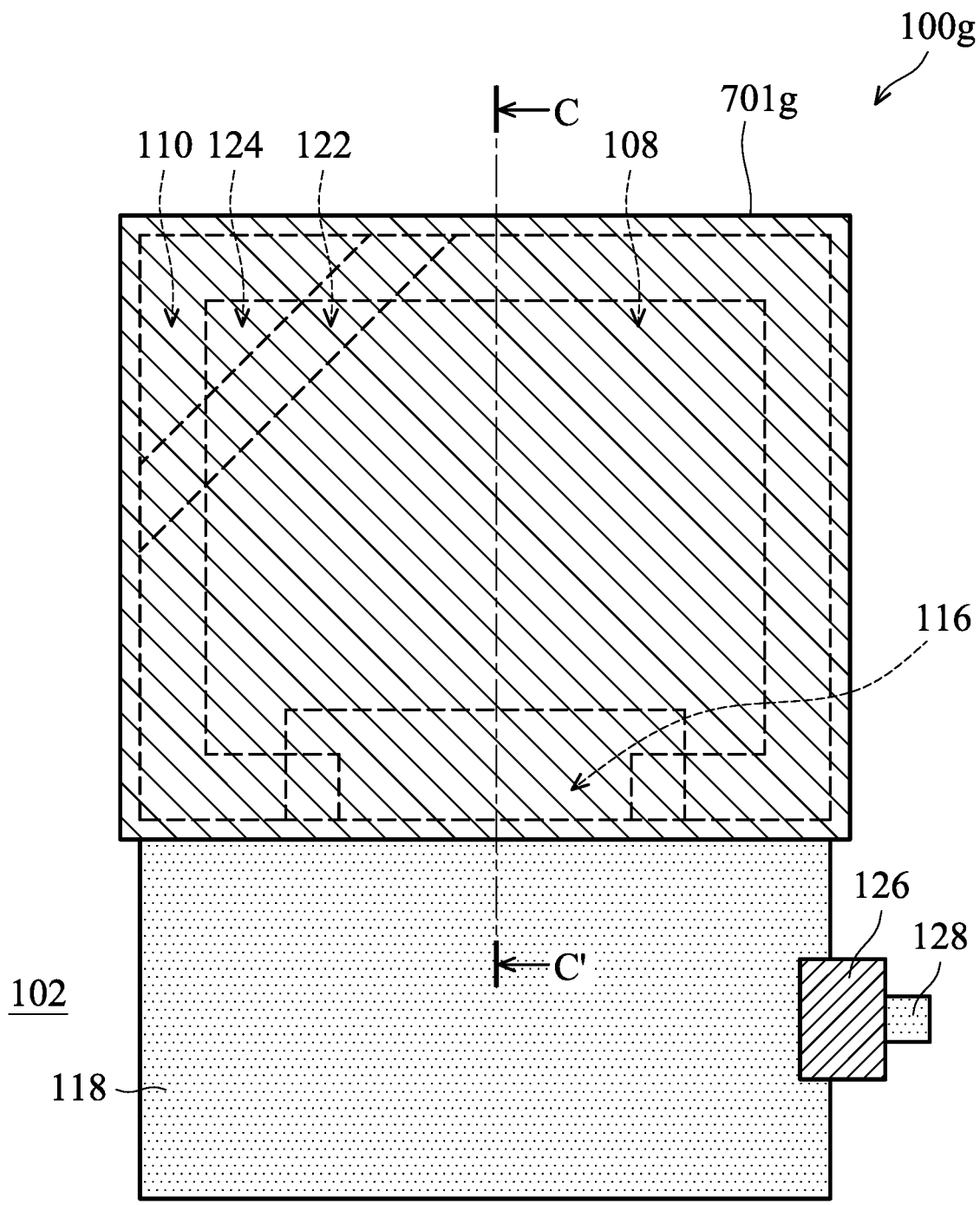
FIG. 7B is a cross-sectional representation of the image sensor structure along line C-C' in accordance with some embodiments.

FIG. 7A is a pixel layout shown from a front side of an image sensor structure 100g in accordance with some embodiments. FIG. 7B is a cross-sectional representation of the image sensor structure 100g along line C-C' in accordance with some embodiments. The image sensor structure 100g may be similar to the image sensor structure 100a described previously, except that a cap layer 701g is formed in the image sensor structure 100g. Elements, materials, and processes described previously may not be repeated herein.

More specifically, the image sensor structure 100g includes the substrate 102, the front side isolation structure 110, the backside isolation structure 112, the light-sensing region 108, the gate structure 116, the storage node 118, the interlayer dielectric layer 130, the interconnect structure layer 132, the supporting substrate 134, the light shielding layer 120, the antireflective layer 136, the color filter layer 138, and the microlens layer 140, as shown in FIGS. 7A and 7B in accordance with some embodiments.

In addition, the image sensor structure 100g includes a cap layer 701g formed in the interlayer dielectric layer 130. As shown in FIG. 7A, the cap layer 701g is formed over the front side 104 of the substrate 102, so that the light-sensing region 108 is covered by the cap layer 701g. The formation of the cap layer 701g is configured to prevent the incident light from entering the storage node 118 through the layers formed over the light-sensing region 108 (e.g. the interlayer dielectric layer 130) due to light diffraction or reflection. In some embodiments, the cap layer 701a is a flat layer formed over the light-sensing region 108 and is not in direct contact with the gate structure 116, as shown in FIG. 7B. In some embodiments, the cap layer 701g is made of a metal, such as tungsten, aluminum, or copper.

Figure 8A:
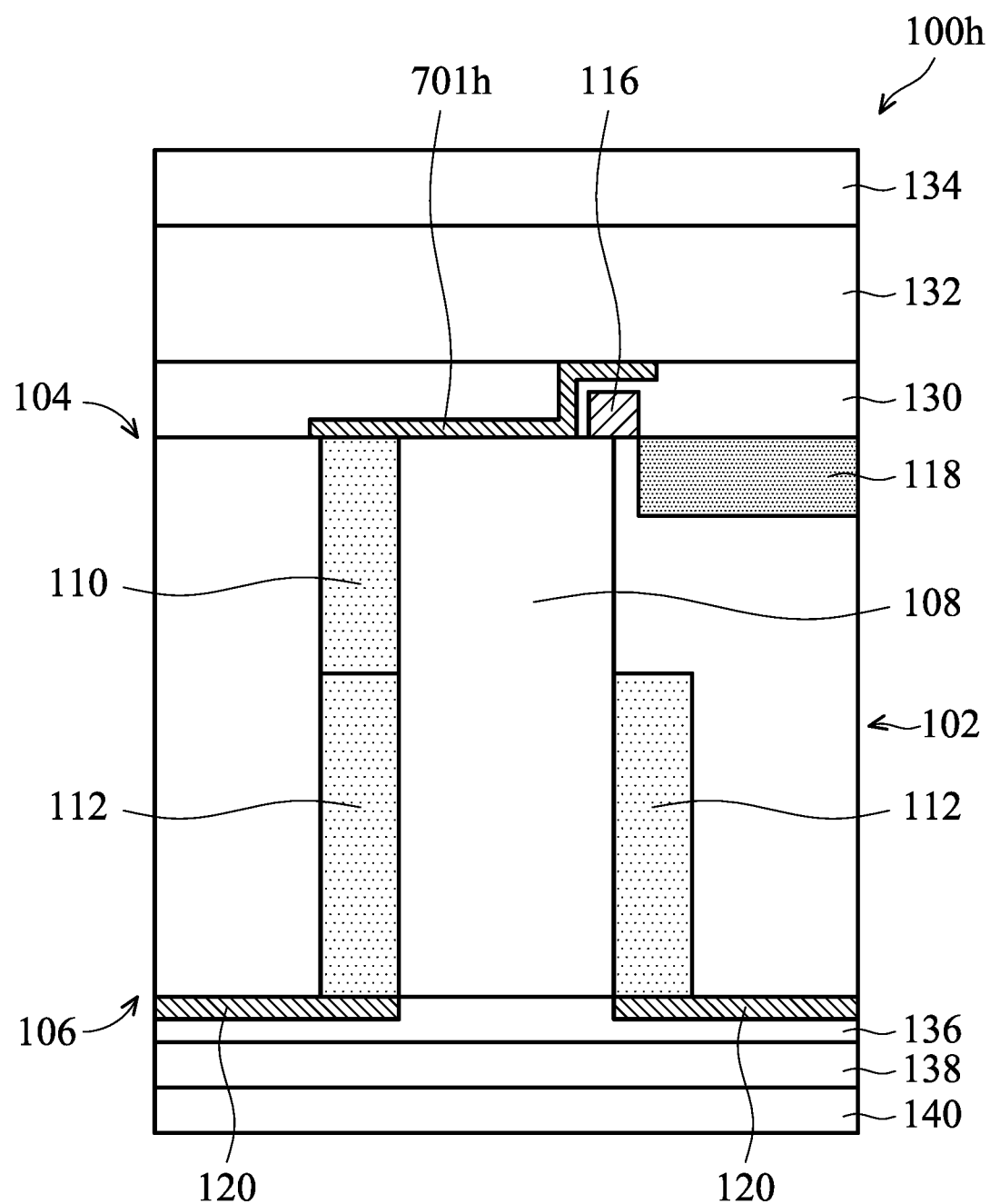
FIGS. 8A and 8B are cross-sectional representations of image sensor structures in accordance with some embodiments.
Figure 8B:
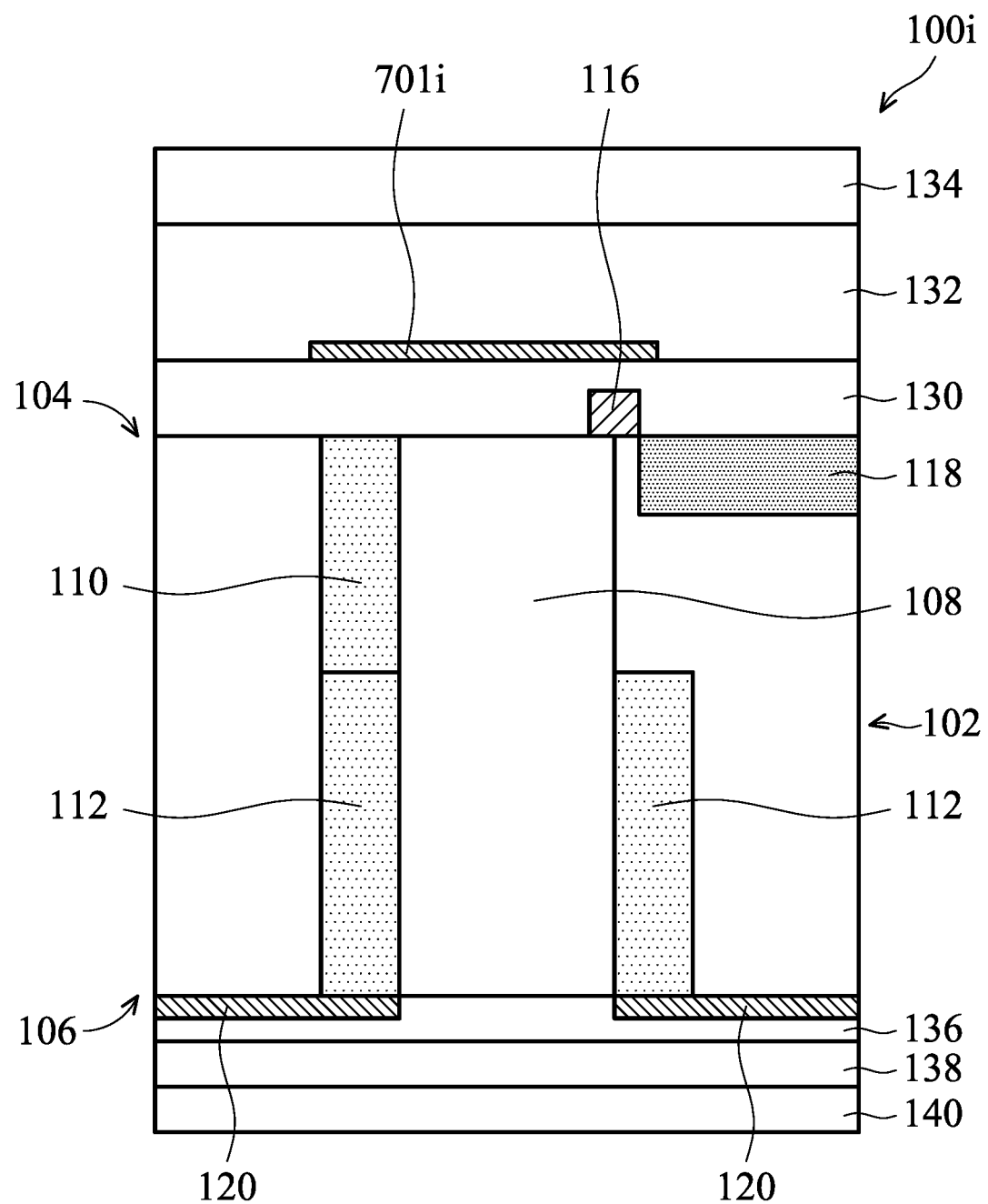

FIGS. 8A and 8B are cross-sectional representations of image sensor structures 100h and 100i in accordance with some embodiments. The image sensor structure 100h is similar to the image sensor structure 100g, except that the position of a cap layer 701h formed in the image sensor structure 100h is different from that of the cap layer 701g, as shown in FIG. 8A in accordance with some embodiments. In some embodiments, a portion of the cap layer 701h is directly formed on the light-sensing region 108 and therefore is in direct contact with the top surface of the light-sensing region 108. In some embodiments, the cap layer 701h has a step-like shape formed along the sidewall and the top surface of the gate structure 116, but the cap layer 701h is not in direct contact with the gate structure 116. Since the cap layer 701h is directly formed on the light-sensing region 108, the parasitic light can be reduced.

The image sensor structure 100i is similar to the image sensor structure 100g, except that a cap layer 701i in the image sensor structure 100i is formed in the interconnect structure layer 132 instead of interlayer dielectric layer 130, as shown in FIG. 8B in accordance with some embodiments. As shown in FIG. 8B, the cap layer 701i is formed in the interconnect structure layer 132. In some embodiments, the cap layer 701i is also used as a metal line in the interconnect structure layer 132. That is, other conductive features formed in the interconnect structure layer 132 are electrically connected to the cap layer 701i in accordance with some embodiments.

Figure 9A:
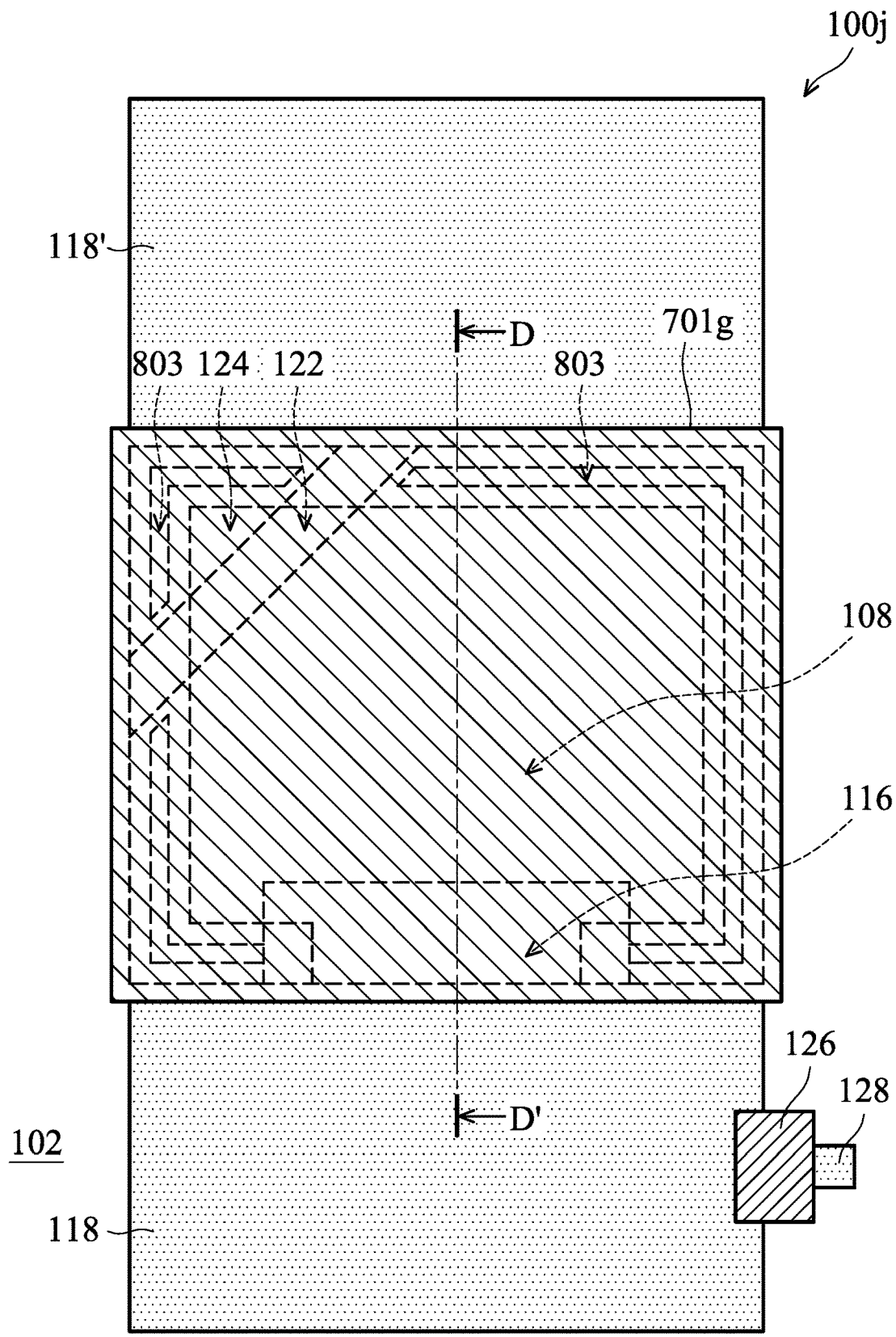
FIG. 9A is a pixel layout shown from a front side of an image sensor structure in accordance with some embodiments.
Figure 9B:
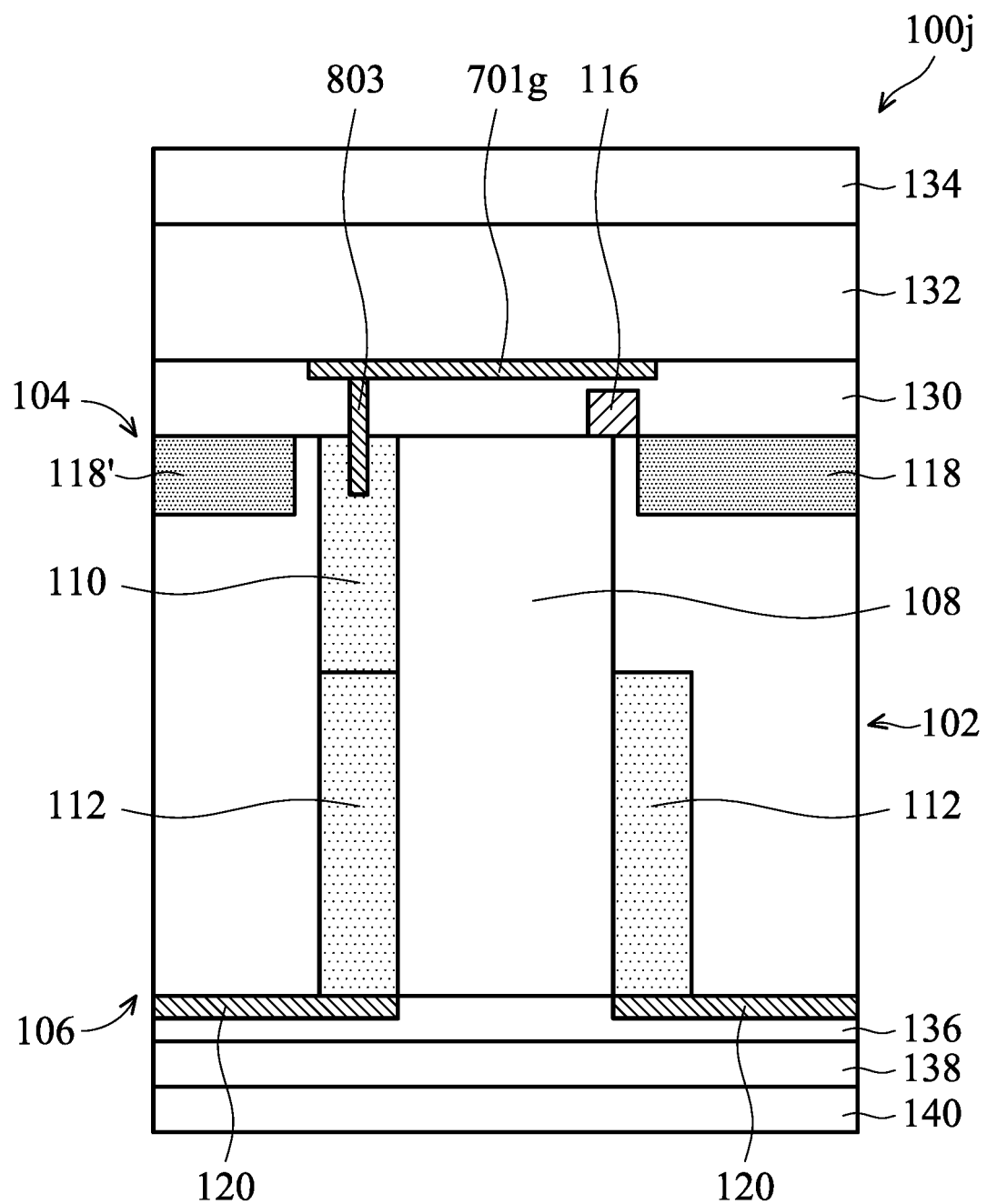
FIG. 9B is a cross-sectional representation of the image sensor structure along line D-D' in accordance with some embodiments.

FIG. 9A is a pixel layout shown from a front side of an image sensor structure 100j in accordance with some embodiments. FIG. 9B is a cross-sectional representation of the image sensor structure 100j along line D-D' in accordance with some embodiments. The image sensor structure 100j may be similar to, or the same as, the previously described image sensor structure 100g, except that a blocking structure 803 is formed in the image sensor structure 100j. Elements, materials, and processes described previously may not be repeated herein.

As shown in FIG. 9B, the image sensor structure 100j includes the blocking structure 803 which is configured to prevent the incident light from entering the storage node formed nearby (e.g. a storage node 118' formed in the neighboring pixel) in accordance with some embodiments. In some embodiments, the blocking structure 803 is in direct contact with the cap layer 701g and the front side isolation structure 110. In some embodiments, a portion of the blocking structure 803 extends into the front side isolation structure 110. In some embodiments, the blocking structure 803 and the cap layer 701g are made of the same material. In some embodiments, the blocking structure 803, the cap layer 701g, and the front side isolation structure 110 are made of the same material. In some embodiments, the blocking structure 803 is made of a metal, such as tungsten, aluminum, or copper.

Figure 10:
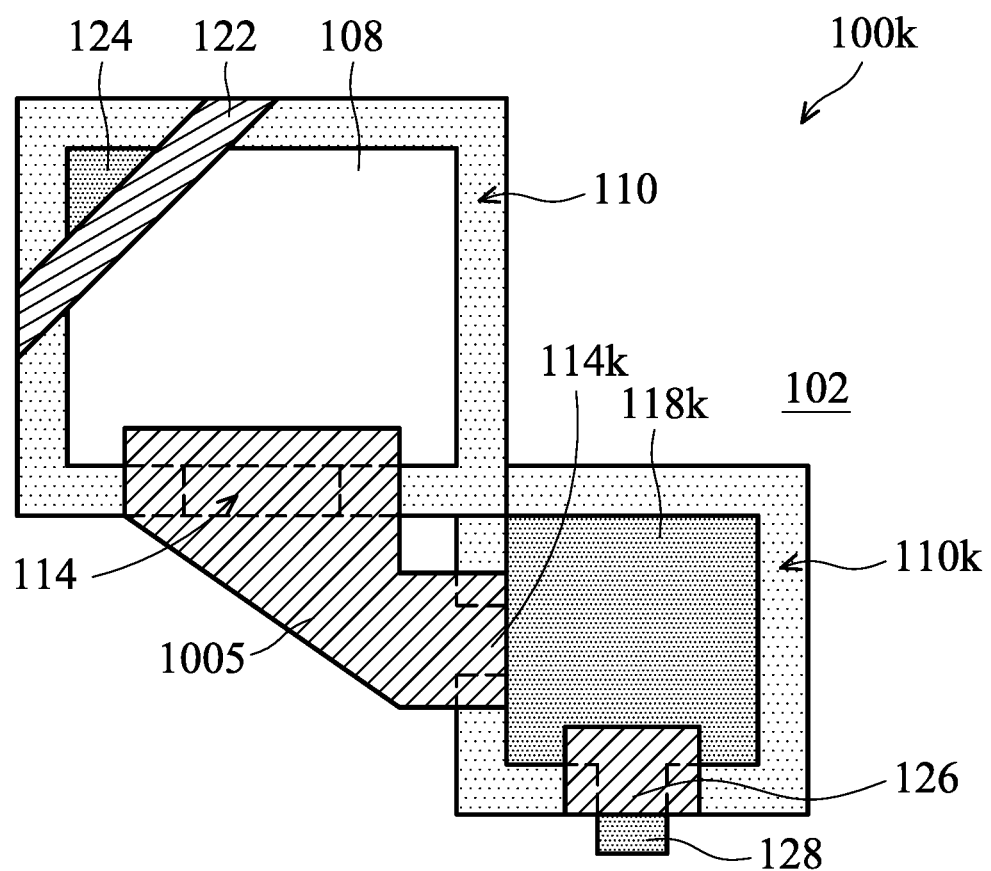
FIG. 10 is a pixel layout shown from a front side of an image sensor structure in accordance with some embodiments.

FIG. 10 is a pixel layout shown from a front side of an image sensor structure 100k in accordance with some embodiments. Some portions of image sensor structure 100k may be similar to, or the same as, those of the previously described image sensor structure 100f and may not be repeated herein. In addition, the features shown in FIGS. 1A to 9B described previously may also be formed in the image sensor structure 100k, although they may not be shown in FIG. 10.

The image sensor structure 100k includes a storage node 118k formed over the front side of the substrate 102. In addition, the storage node 118k is located at a position where the storage node 118k is separated from the light-sensing region 108 by the front side isolation structure 110. That is, instead of being positioned next to the opening region 114 of the front side isolation structure 110 (as the storage node 118 described previously), the storage node 118k is formed at the portion staggered from the opening region 114. In some embodiments, the storage node 118k is placed at the diagonal position from the light-sensing region 108.

As shown in FIG. 10, the light-sensing region 108, the opening region 114 of the front side isolation structure 110, and the storage node 118k are not aligned in a straight line in the layout from the top view. Accordingly, although the front side isolation structure 110 also has the opening region 114, the risk of parasitic light entering the storage node 118k through the opening region 114 may be reduced. However, since storage node 118k is not positioned next to the opening region 114, a gate structure 1005 is formed over the front side of the substrate 102 to connect the light-sensing region 108 and the storage node 118k. The gate structure 1005 can be seen as a transfer gate structure. The electrons induced in the light-sensing region 108 can be transferred to the storage node 118k through the gate structure 1005.

In some embodiments, the storage node 118k is surrounded by additional isolation structure 110k. In addition, the isolation structure 110k also has an opening region 114k, so that a portion of the storage node 118k is not surrounded by the isolation structure 114k. As shown in FIG. 10, one end of the gate structure 1005 overlaps with the opening region 114 of the front side isolation structure 110, and the other end of the gate structure 1005 overlaps with the opening region 114k of the isolation structure 110k. The materials and processes used to form the isolation structure 110k may be similar to, or the same as, those used to form the previously described front side isolation structure 110. In addition, it should be noted that, although the storage node 118k is formed in a position different from that of the storage node 118 described previously, the materials and processes used to form the storage node 118k may be similar to, or the same as, those used to form the previously described storage node 118 and are not repeated herein.

Figure 11A:
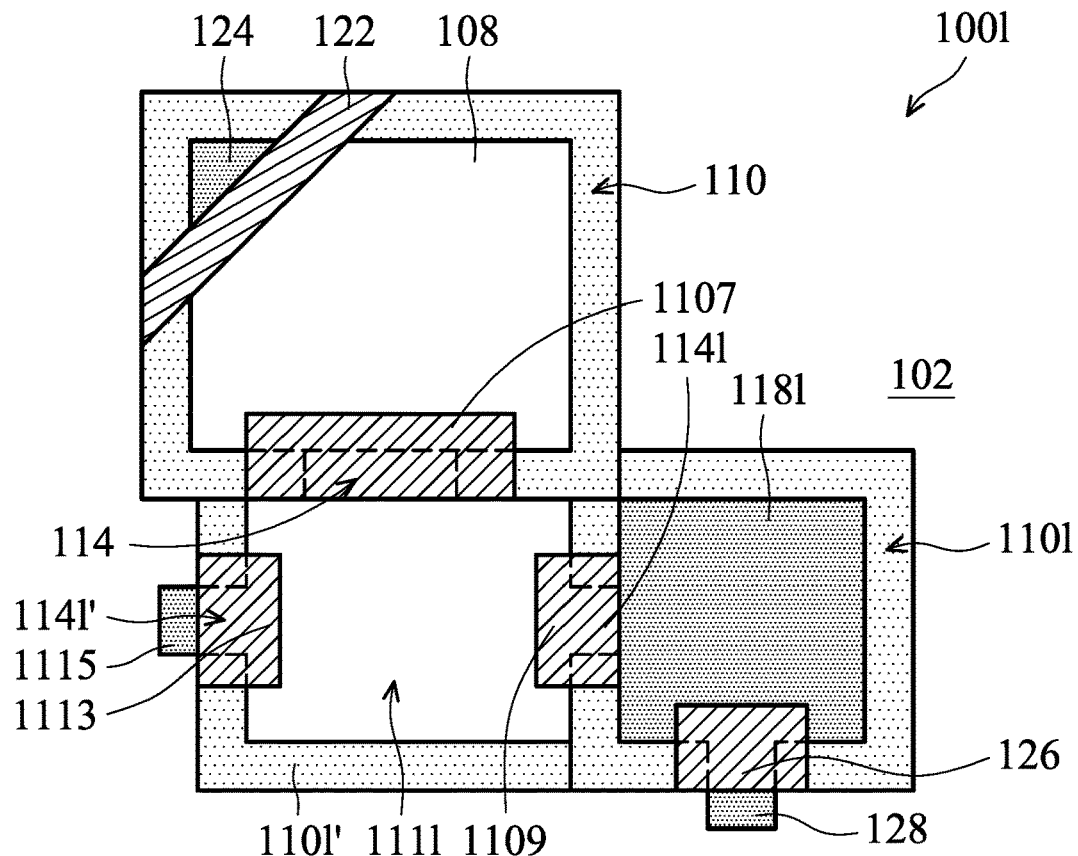
FIG. 11A is a pixel layout shown from a front side of an image sensor structure in accordance with some embodiments.

FIG. 11A is a pixel layout shown from a front side of an image sensor structure 100l in accordance with some embodiments. Some portions of image sensor structure 100l may be similar to, or the same as, those of the previously described image sensor structure 100k and may not be repeated herein. In addition, the features described previously may also be formed in the image sensor structure 100k, although they may not be shown in FIG. 10.

Similar to the image sensor structure 100k, the image sensor structure 100l also includes a storage node 118l formed at the front side of the substrate 102, as shown in FIG. 11A in accordance with some embodiments. In addition, the storage node 118l is located at a position where the storage node 118l is separated from the light-sensing region 108 by the front side isolation structure 110. The position of the storage node 118l and the formation of it may be similar to, or the same as, those of the storage node 118k described above.

As described previously, since the light-sensing region 108, the opening region 114 of the front side isolation structure 110, and the storage node 118l are not aligned in a straight line in the layout, the risk of parasitic light entering the storage node 118l through the opening region 114 may be reduced. In addition, the storage node 118l is surrounded by an additional isolation structure 110l, and the isolation structure 110l also has an opening region 114l. In some embodiments, a gate structure 1107 is formed over the opening region 114 of the front side isolation structure 110, and a gate structure 1109 is formed over the opening region 114l of the isolation structure 110l.

As shown in FIG. 11A, the image sensor structure 100l includes an intermediate region 111l. The gate structure 1107 is formed at one side of the intermediate region 1111, and the gate structure 1109 is formed at the other region of the intermediate region 1111. In some embodiments, the intermediate region 1111 is surrounded by an isolation structure 110l'.

In some embodiments, an intermediate transistor structure is formed at another side of the intermediate region 1111. In some embodiments, the intermediate transistor structure includes an intermediate gate structure 1113 and an intermediate node 1115 formed adjacent to the intermediate gate structure 113. When the intermediate transistor structure is turned on, unwanted charges coming to the intermediate region 1111 may be directed away by the intermediate transistor structure. On the other hand, when the intermediate transistor structure is turned off, the signals induced by the light-sensing region 108 (e.g. the integrated charged) may be directed to the storage node 118l. It should be noted that, although the intermediate transistor is shown in FIG. 11A, it is not used in some other embodiments. That is, the formation of the intermediate transistor may be optional according to its applications.

Figure 11B:
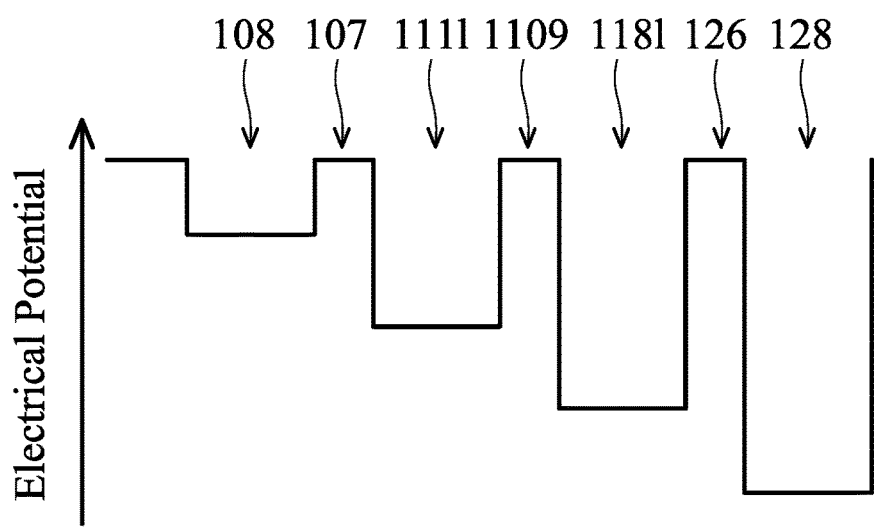
FIG. 11B is a representation of a possible electrical potential in different area of the image sensor structure in accordance with some embodiments.

FIG. 11B is a representation of a possible electrical potential in different area of the image sensor structure 100l in accordance with some embodiments. As shown in FIG. 11B, the y-axis represents the electrical potential in each area. The electrical potential in the light-sensing region 108 is greater than the electrical potential in the intermediate region 1111, and the electrical potential in the intermediate region 1111 is greater than the electrical potential in the storage node 118l. In addition, the electrical potential in the storage node 118l is greater than the floating node 128. Furthermore, the gate structures 1107, 1141, and 126 may be used to control the electrons passing through. In some embodiments, the electrical potential of these regions may be adjusted by controlling the dopant's concentration in each region.

Figure 12A:
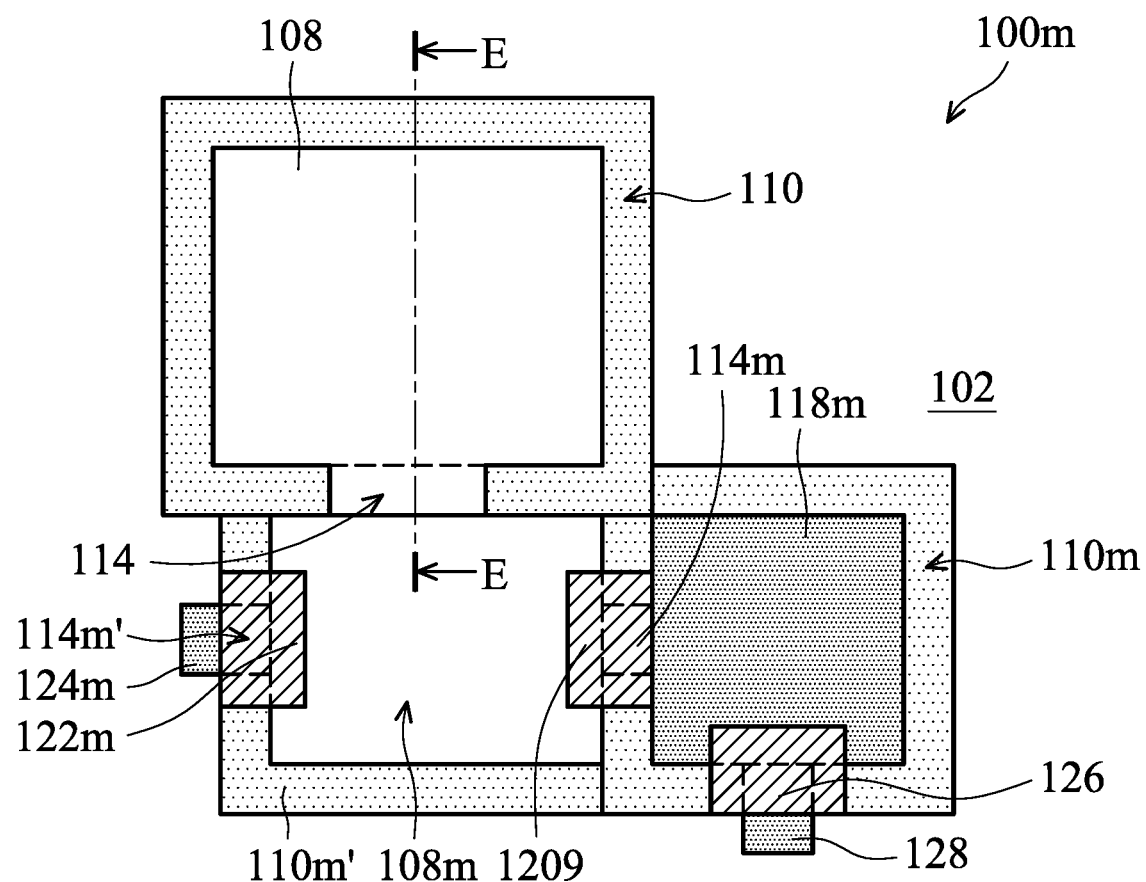
FIG. 12A is a pixel layout shown from a front side of an image sensor structure in accordance with some embodiments.
Figure 12B:
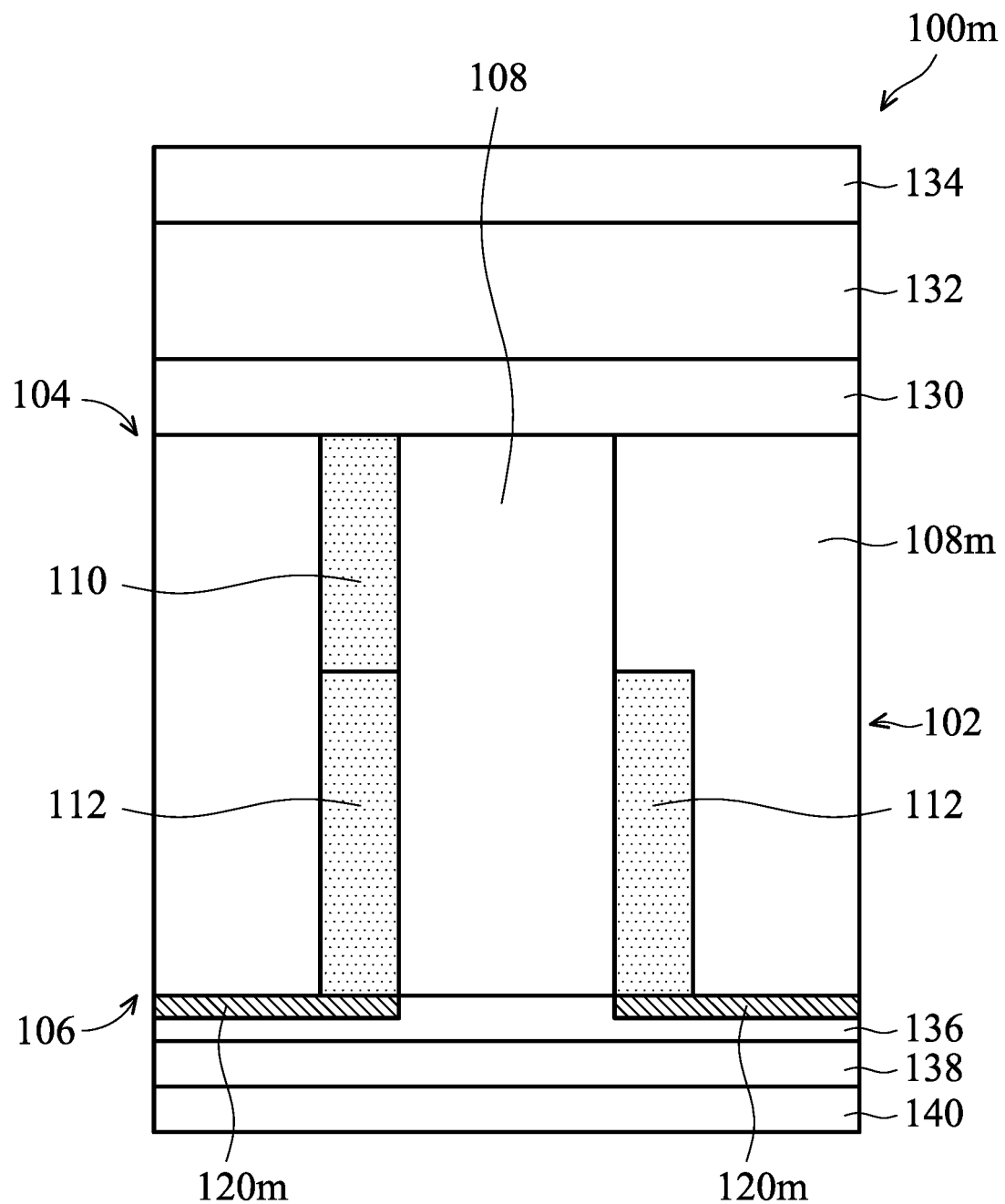
FIG. 12B is a cross-sectional representation of the image sensor structure alone line E-E' shown in FIG. 12A in accordance with some embodiments.

FIG. 12A is a pixel layout shown from a front side of an image sensor structure 100m in accordance with some embodiments. FIG. 12B is a cross-sectional representation of the image sensor structure 100m alone line E-E' shown in FIG. 12A in accordance with some embodiments. Some portions of image sensor structure 100m may be similar to, or the same as, those of the previously described image sensor structure 100k and may not be repeated herein.

Similar to the image sensor structure 100k, the image sensor structure 100m also includes a storage node 118m formed at the front side of the substrate 102, as shown in FIG. 12A in accordance with some embodiments. In addition, the storage node 118m is located at a position where the storage node 118m is separated from the light-sensing region 108 by the front side isolation structure 110. The position of the storage node 118m and the formation of it may be similar to, or the same as, those of the storage node 118k described above. In some embodiments, a gate structure 1209 is formed over an opening region 114m of the isolation structure 110m.

As described previously, since the light-sensing region 108, the opening region 114 of the front side isolation structure 110, and the storage node 118m are not aligned in a straight line in the layout, the risk of parasitic light entering the storage node 118m through the opening region 114 may be reduced. In addition, the storage node 118m is surrounded by an additional isolation structure 110l, and the isolation structure 110m also has an opening region 114m.

Furthermore, the image sensor structure 100m further includes an additional photodiode region 108m, as shown in FIGS. 12A and 12B in accordance with some embodiments. The additional photodiode region 108m is formed next to the opening region 114 of the front side isolation structure 110, so that the electrons induced in the light-sensing region 108 can be transferred into the additional photodiode region 108m. In some embodiments, the light-sensing region 108 also includes a photodiode region, and the two photodiode regions are formed at the opposite sides of the opening region 114 of the front side isolation structure 110.

In addition, the image sensor structure 100m includes a light shielding layer 120m, which is similar to, or the same as, the light shielding layer 120 described previously. As shown in FIG. 12B, the light-sensing region 108 is not covered by the light shielding layer 120m, and therefore the incident light can enter the light-sensing region 108 from the backside 106 of the substrate 102. On the other hand, the additional photodiode region 108m is covered by the light shielding layer 120m, and therefore the incident light cannot directly enter the additional photodiode region 108m from the backside 106 of the substrate 102. However, since the light-sensing region 108 and the additional photodiode region 108m are not isolated from each other at the opening region 114, the electrons in the light-sensing region 108 can be stored in the additional photodiode region 108m. Therefore, the full-well capacity of the image sensor structure 100m can be increased.

In addition, a lateral overflow transistor structure, including a gate structure 122m and a drain structure 124m, is formed at a side of the additional photodiode region 108m. The function and processes for forming the gate structure 122m and the drain structure 124m may be similar to, or the same as, those of the gate structure 122 and the drain structure 124 described previously and are not repeated herein.

Figure 12C:
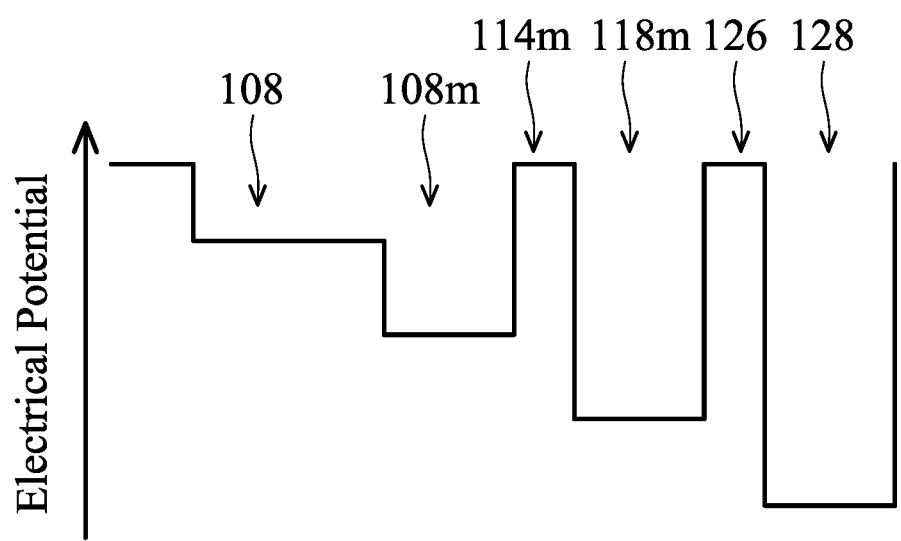
FIG. 12C is a representation of a possible electrical potential in different area of the image sensor structure in accordance with some embodiments.

FIG. 12C is a representation of a possible electrical potential in different area of the image sensor structure 100m in accordance with some embodiments. Similar to FIG. 11B, the y-axis in FIG. 12C represents the electrical potential in each area. The electrical potential in the light-sensing region 108 is greater than the electrical potential in the additional photodiode region 108m, and the electrical potential in the additional photodiode region 108m is greater than the electrical potential in the storage node 118m. In addition, the electrical potential in the storage node 118m is greater than the floating node 128. Furthermore, the conductive structures 114m and 126 may be used to control the electrons passing through. In some embodiments, the electrical potential of these regions may be adjusted by controlling the dopant's concentration in each region.

It should be noted that the gate structures described above may be multi-gate structures, such that the number of the gate structures formed in a given area can be increased. Therefore, the size of the image sensor structures may be minimized.

The image sensor structures described previously, including image sensor structures 100a to 100m, may be BSI image sensor structures. In addition, global shutter structures may also be applied in the BSI image sensor structures. As described previously, storage nodes, such as the storage node 118, are formed on the front side 104 of the substrate 102 and are positioned near the light-sensing region 108. Accordingly, the electrons induced in the light-sensing region 108 can be transferred into the storage node 118, and therefore the image acquisition can be performed simultaneously. Accordingly, the performance of the image sensor structure can be improved.

In addition, when the storage node 118 is formed in the front side 104 of the substrate, the light shielding layer 120, the front side isolation structure 110, and the backside isolation structure 112 are also formed to prevent the incident light from directly entering the storage node 118. However, the light-sensing region 108 is not completely surrounded by the front side isolation structure 110, so that the electrons can be transferred into the storage node 118 through the opening region 114.

Furthermore, in some embodiments, the cap layer 701g is formed to prevent the light from entering the storage node 118 due to diffraction or reflection in the layers positioned over the light-sensing region 108. In some embodiments, the blocking structure 803 is also formed to block the light from entering the neighboring storage node, such as the storage node 118'. Accordingly, the risk of parasitic light entering the storage node may be reduced further.

In some embodiments, the storage node, such as the storage node 118k, 118l, or 118k, is formed at a position away from the opening 114 of the front side isolation structure 110. By misaligning the opening region 114, which exposes the light-sensing region 108, and the storage node, parasitic light may be prevented. In addition, additional gate structures, such as gate structures 1005, 1107, 1109, and 1209, may be used, so that the electrons induced in the light-sensing region 108 can still be transferred into the storage node. In some embodiments, the additional photodiode region 108m is formed next to the light-sensing region 108, and the full-well capacity of the image sensor structure can be increased.

Embodiments of image sensor structures and methods for manufacturing the same are provided. The image sensor structure includes a light-sensing region formed in a substrate, and a storage node formed near the light-sensing region. In addition, the image sensor structure further includes a front side isolation structure formed in the front side of the substrate, and a backside isolation structure formed in the backside of the substrate. The upper portion of the light-sensing region is partially surrounded by the front side isolation structure, and the bottom portion of the light-sensing region is fully surrounded by the backside isolation structure. The front side isolation structure and the backside isolation structure can prevent light from directly entering the storage node, while the electrons induced in the light-sensing region can be transferred to the storage node through an opening region of the front side isolation structure. Therefore, the performance of the image sensor structure can be improved.

In some embodiments, a method for manufacturing an image sensor structure is provided. The method includes forming a light-sensing region in a substrate and forming a storage node adjacent to light-sensing region in the substrate. The method further includes forming a front side isolation structure partially surrounding an upper portion of the light-sensing region and forming a trench fully surrounding a bottom portion of the light-sensing region to expose a bottom surface of the front side isolations structure. The method further includes forming a backside isolation structure in the trench.

In some embodiments, a method for manufacturing an image sensor structure is provided. The method includes forming a light-sensing region in a substrate and forming a storage node adjacent to the light-sensing region. The method further includes forming a first trench partially surrounding an upper portion of the light-sensing region in the substrate and forming a front side isolation structure in the first trench. The method further includes forming a second trench surrounding a bottom portion of the light-sensing region and partially overlaps with the storage node in the substrate and forming a backside isolation in the second trench.

In some embodiments, a method for manufacturing an image sensor structure is provided. The method for manufacturing the image sensor structure includes forming a light-sensing region in a substrate and forming a first trench from a front side of the substrate. In addition, the first trench partially surrounds the light-sensing region. The method for manufacturing the image sensor structure further includes filling a first material in the first trench to form a front side isolation structure and forming a second trench from a backside of the substrate. In addition, the second trench fully surrounds the light-sensing region. The method for manufacturing the image sensor structure further includes filling a second material in the second trench to form a backside isolation structure. In addition, the first material is different from the second material and is in direct contact with the second material.

In some embodiments, an image sensor structure is provided. The image sensor structure includes a substrate having a front side and a backside and a light-sensing region formed in the substrate. The image sensor structure further includes a front side isolation structure surrounding the light sensing region and having an opening region in a top view and a backside isolation structure formed at the backside of the substrate and encompassing the light-sensing region and vertically overlapping the opening region. The image sensor structure further includes a first gate structure formed over the front side of the substrate and overlapping the opening region and the front side isolation structure and a storage node in the substrate adjacent to the first gate structure. In addition, the storage node extends into the opening region.

In some embodiments, an image sensor structure is provided. The image sensor structure includes a substrate having a front side and a backside and a light-sensing region formed in the substrate. The image sensor structure further includes a front side isolation structure formed at the front side of the substrate and a backside isolation structure formed at the backside of the substrate and laterally encompassing the light-sensing region. The image sensor structure further includes a gate structure formed over the front side of the substrate and covering a portion of the light-sensing region and a storage node formed at the front side of the substrate adjacent to the gate structure. In addition, the storage node vertically overlaps the backside isolation structure.

In some embodiments, an image sensor structure is provided. The image sensor structure includes a substrate having a front side and a backside and a light-sensing region formed in the substrate. The image sensor structure further includes a front side isolation structure surrounding the light sensing region and having a first opening region in a top view. In addition, the front side isolation structure is made of a dielectric material. The image sensor structure further includes a backside isolation structure encircling the light-sensing region at the backside of the substrate. In addition, the backside isolation structure is made of a metal. Furthermore, the backside isolation structure is directly below the first opening region.

In some embodiments, an image sensor structure is provided. The image sensor structure includes a substrate and a light-sensing region formed in the substrate. The image sensor structure further includes a first isolation structure surrounding the light sensing region and having an opening region in a top view and a second isolation structure formed in the substrate. In addition, the second isolation structure surrounds the light-sensing region and vertically overlaps both the opening region and the first isolation structure. The image sensor structure further includes a first gate structure formed over the substrate and overlapping the opening region, the first isolation structure, and the second isolation structure.

In some embodiments, an image sensor structure is provided. The image sensor structure includes a substrate and a light-sensing region formed in the substrate. The image sensor structure further includes a first isolation structure formed at a first side of the substrate and a second isolation structure formed at a second side of the substrate and laterally surrounding the light-sensing region. The image sensor structure further includes a storage node formed at the first side of the substrate. In addition, the storage node vertically overlaps the second isolation structure.

In some embodiments, an image sensor structure is provided. The image sensor structure includes a substrate and a light-sensing region formed in the substrate. The image sensor structure further includes a first isolation structure surrounding the light sensing region at a first side of the substrate and having an opening region in a top view and a second isolation structure encircling the light-sensing region at a second side of the substrate. The image sensor structure further includes a first gate structure formed over the first side of the substrate and a light shielding layer formed at the second side of the substrate. In addition, the first gate structure vertically overlaps the opening region, the first isolation structure, the second isolation structure, and the light shielding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor structure, comprising:
a substrate;
a light-sensing region formed in the substrate;
a first isolation structure surrounding the light sensing region and having an opening region in a top view;
a second isolation structure formed in the substrate, wherein the second isolation structure surrounds the light-sensing region and vertically overlaps both the opening region and the first isolation structure;
a first gate structure formed over the substrate and overlapping the opening region, the first isolation structure, and the second isolation structure.

2. The image sensor structure as claimed in claim 1, further comprising:
a light shielding layer covering a bottom surface of the second isolation structure.

3. The image sensor structure as claimed in claim 1, further comprising:
an interconnect structure layer formed over the substrate and covering the first gate structure.

4. The image sensor structure as claimed in claim 1, further comprising:
a second gate structure formed over the substrate and covering the first isolation structure and the light-sensing region.

5. The image sensor structure as claimed in claim 4, wherein the first gate structure and the second gate structure separates from each other.

6. The image sensor structure as claimed in claim 5, further comprising:
a storage node formed adjacent to the first gate structure in the substrate; and
a drain structure formed adjacent to the second gate structure in the substrate.

7. The image sensor structure as claimed in claim 6, wherein the drain structure vertically overlaps the light-sensing region without in direct contact with the light-sensing region.

8. The image sensor structure as claimed in claim 6, wherein the drain structure is in direct contact with the first isolation structure.

9. An image sensor structure, comprising:
a substrate;
a light-sensing region formed in the substrate;
a first isolation structure formed at a first side of the substrate;
a second isolation structure formed at a second side of the substrate and laterally surrounding the light-sensing region; and
a storage node formed at the first side of the substrate,
wherein the second isolation structure has a first sidewall surface coincident with a first surface, and the storage node laterally extending at opposite sides of the first surface.

10. The image sensor structure as claimed in claim 9, further comprising:
a light shielding layer formed at the second side of the substrate, wherein the light shielding layer is in direct contact with the second isolation structure.

11. The image sensor structure as claimed in claim 10, wherein the light shielding layer is in direct contact with a backside surface of the second isolation structure.

12. The image sensor structure as claimed in claim 9, further comprising:
a gate structure formed over the first side of the substrate;
a dielectric layer formed over the first side of the substrate and covering the gate structure; and
an interconnect structure layer formed over the dielectric layer.

13. The image sensor structure as claimed in claim 12, further comprising:
a cap layer formed over the first side of the substrate and covering the light-sensing region, the gate structure, and the first isolation structure.

14. The image sensor structure as claimed in claim 13, wherein the cap layer is in direct contact with the light-sensing region and the first isolation structure.

15. The image sensor structure as claimed in claim 13, wherein a first portion of the cap layer over the gate structure is higher than a second portion of the cap layer over the light sensing region.

16. An image sensor structure, comprising:
a substrate;
a light-sensing region formed in the substrate;
a first isolation structure surrounding the light sensing region at a first side of the substrate and having an opening region in a top view;
a second isolation structure encircling the light-sensing region at a second side of the substrate;
a first gate structure formed over the first side of the substrate; and
a light shielding layer formed at the second side of the substrate,
wherein the first gate structure vertically overlaps the opening region, the first isolation structure, the second isolation structure, and the light shielding layer.

17. The image sensor structure as claimed in claim 16, further comprising:
a storage node formed in the first side of the substrate and overlapping the light shielding layer.

18. The image sensor structure as claimed in claim 17, further comprising:
a second gate structure formed over the first side of the substrate and covering a portion of the light sensing region.

19. The image sensor structure as claimed in claim 18, further comprising:
a drain structure formed adjacent to the second gate structure in the substrate,
wherein the drain structure and the storage node are at opposite sides of the first gate structure.

20. The image sensor structure as claimed in claim 19, wherein a bottom surface of the drain structure is higher than a bottom surface of the storage node in a cross-sectional view.

* * * * *